(12) United States Patent
Kikuchi et al.

(10) Patent No.: US 8,692,364 B2
(45) Date of Patent: Apr. 8, 2014

(54) SEMICONDUCTOR DEVICE AND METHOD FOR MANUFACTURING THE SAME

(75) Inventors: Katsumi Kikuchi, Tokyo (JP); Yoshiki Nakashima, Tokyo (JP); Kentaro Mori, Tokyo (JP); Shintaro Yamamichi, Tokyo (JP)

(73) Assignee: NEC Corporation, Tokyo (JP)

( * ) Notice: Subject to any disclaimer, the term of this patent is extended or adjusted under 35 U.S.C. 154(b) by 226 days.

(21) Appl. No.: 13/389,234

(22) PCT Filed: Aug. 6, 2010

(86) PCT No.: PCT/JP2010/063386
§ 371 (c)(1),
(2), (4) Date: Feb. 6, 2012

(87) PCT Pub. No.: WO2011/016555
PCT Pub. Date: Feb. 10, 2011

(65) Prior Publication Data
US 2012/0133052 A1    May 31, 2012

(30) Foreign Application Priority Data
Aug. 7, 2009  (JP) .................. 2009-184997

(51) Int. Cl.
*H01L 23/06*    (2006.01)
*H01L 23/48*    (2006.01)
*H01L 23/02*    (2006.01)
*H01L 23/522*   (2006.01)
*H01L 21/4763*  (2006.01)
*H01L 21/48*    (2006.01)

(52) U.S. Cl.
USPC .... 257/684; 257/774; 257/678; 257/E23.145; 438/618; 438/637; 438/125

(58) Field of Classification Search
USPC .......... 257/684, 774, 678, E23.145; 438/618, 438/637, 125
See application file for complete search history.

(56) References Cited

U.S. PATENT DOCUMENTS

| | | | |
|---|---|---|---|
| 5,432,677 A * | 7/1995 | Mowatt et al. ................ 361/719 |
| 6,016,598 A * | 1/2000 | Middelman et al. ............ 29/830 |
| 7,217,999 B1 | 5/2007 | Honda | |
| 7,884,484 B2 | 2/2011 | Yamano et al. | |
| 2002/0011351 A1* | 1/2002 | Ogawa et al. ................. 174/260 |
| 2006/0208356 A1 | 9/2006 | Yamano et al. | |
| 2007/0184604 A1 | 8/2007 | Honda | |
| 2009/0218118 A1* | 9/2009 | Tani ............................. 174/256 |

FOREIGN PATENT DOCUMENTS

| | | |
|---|---|---|
| JP | 2-305494 A | 12/1990 |
| JP | 6-334334 A | 12/1994 |
| JP | 8-111570 A | 4/1996 |

(Continued)

*Primary Examiner* — Luan C Thai
(74) *Attorney, Agent, or Firm* — Sughrue Mion, PLLC

(57) ABSTRACT

A semiconductor device includes an embedding layer in which one or more semiconductor element(s) is embedded and one or more interconnect layers as well as one or more insulation layers on one or both sides of the embedding layer. The embedding layer includes a woven cloth formed by reinforcement fibers. The woven cloth has an opening on its site embedding the semiconductor element. The opening is arranged so that direction of the reinforcement fibers will have a preset angle with respect to a direction of a side of or a tangent to at least a portion of the opening, the preset angle being other than a square angle or a zero angle (parallelism).

20 Claims, 15 Drawing Sheets

(56) References Cited

FOREIGN PATENT DOCUMENTS

| JP | 8-139424 A | 5/1996 |
| JP | 9-64493 A | 3/1997 |
| JP | 10-51105 A | 2/1998 |
| JP | 2001-177010 A | 6/2001 |
| JP | 2002-16173 A | 1/2002 |
| JP | 2002-270712 A | 9/2002 |
| JP | 2004-335641 A | 11/2004 |
| JP | 2006-261246 A | 9/2006 |
| JP | 2007-227586 A | 9/2007 |
| JP | 2007-258542 A | 10/2007 |
| JP | 2008-300482 A | 12/2008 |

* cited by examiner

SEMICONDUCTOR DEVICE AND METHOD FOR MANUFACTURING THE SAME

CROSS REFERENCE TO RELATED APPLICATIONS

This application is a National Stage of International Application No. PCT/JP2010/063386, filed on Aug. 6, 2010, which claims priority from Japanese Patent Application No. 2009-184997, filed on Aug. 7, 2009, the contents of all of which are incorporated herein by reference in their entirety.

REFERENCE TO RELATED APPLICATION

This application is based upon and claims the benefit of the priority of Japanese patent application No. 2009-184997, filed on Aug. 7, 2009, the disclosure of which is incorporated herein in its entirety by reference thereto.

TECHNICAL FIELD

This invention relates to a semiconductor device and, more particularly, to a semiconductor device having a semiconductor element embedded within the interior of a wiring substrate.

BACKGROUND

Recently, there is a precipitous demand for miniaturization, reduction in thickness and increase in density of electronic equipment. On the other hand, an operating speed as well as an increase of terminals due to advanced functions of the semiconductor element is enhanced, as a result of which the reduction in thickness and increase in density, in particular, are required of the semiconductor element. To achieve the reduction in thickness and size of the electronic equipment, attention is focused on having component parts, so far arranged on the wiring substrate surface, embedded within the interior of the wiring substrate, so as to reduce the thickness of the electronic equipment.

In Patent Document 1, there is disclosed a substrate technique that uses a vacuum press. A semiconductor element is enclosed in a lower layer wiring substrate formed of an epoxy resin and glass fibers. A pre-preg of substantially the same composition as that of the lower layer wiring substrate and the semiconductor element is used. For enclosing the semiconductor element, the portion of the pre-preg accepting the semiconductor element has been removed.

In Patent Document 2, there is disclosed a structure of a wiring substrate in which the semiconductor chip is enclosed. A reinforcement unit is embedded in an insulation layer in which the semiconductor chip is embedded.

In Patent Document 3, there is disclosed a substrate technique in which a semiconductor element is bonded to a first sheet, a second sheet having an opening is placed thereon, and an electrically conductive third sheet is further placed thereon. The resulting product is thermally pressed together in a lump to get the semiconductor element enclosed in the resulting structure.

In Patent Document 4, a work sheet composed of a glass cloth impregnated with synthetic resin is used. The glass cloth is formed by weaving glass fibers in a lattice shape. The work sheet is cut into a plurality of separated pieces of insulation substrates so that the lateral side of each piece of insulation substrate extends for intersecting the placement direction of the glass fibers. The through-holes that are to become side through-holes and a conductor circuit are formed on each piece of insulation substrate. Each piece of insulation substrate is cut out in the direction intersecting the glass giber placement direction of the glass cloth, such as at 40° to 50°, in such a manner that each of the through-holes is halved, in order to complete the separated pieces of insulation substrate.

[Patent Document 1]
JP Patent Kokai Publication No. JP-P2002-270712A
[Patent Document 2]
JP Patent Kokai Publication No. JP-P2006-261246A
[Patent Document 3]
JP Patent Kokai Publication No. JP-P2004-335641A
[Patent Document 4]
JP Patent Kokai Publication No. JP-A-8-139424
[Patent Document 5]
JP Patent Kokai Publication No. JP-A-10-51105
[Patent Document 6]
JP Patent Kokai Publication No. JP-A-9-64493
[Patent Document 7]
JP Patent Kokai Publication No. JP-A-6-334334

SUMMARY

The entire disclosures of the above Patent Documents 1-7 are incorporated herein by reference thereto.

The following analysis is from the standpoint of the present invention. In keeping up with the miniaturization of electronic equipment, there is raised a demand for reducing the thickness and the size of the semiconductor device itself. As a means therefor, enclosing a semiconductor element in the electronic equipment is investigated. The semiconductor element is formed of an inorganic material, such as silicon, which is of a thermal expansion coefficient lower than that of an organic material used in e.g. a wiring substrate. There is thus a risk that warping is produced in a semiconductor device in which the semiconductor element is enclosed. In case the semiconductor element is further reduced in size and thickness, warping becomes more apparent, on account of the difference in the thermal expansion coefficient of the wiring substrate from that of the semiconductor element, due to deterioration in toughness of the wiring substrate resulting from reduction in thickness. In addition, since the semiconductor device is deteriorated in handling performance, it becomes difficult to have other components loaded thereon or to have the semiconductor device loaded on a separate substrate.

In the Patent Documents 1 to 3, a reinforcement containing material is used in the vicinity of the semiconductor element in the total of the insulation layers of the wiring substrate or in the layer in which the semiconductor element is embedded. It is because the substrate in its entirety needs to be tough and the difference between the thermal expansion coefficient of the semiconductor element and that of the insulation layer is to be decreased. To provide for increased toughness, a woven fabric is used in preference to a non-woven fabric, and use of a glass cloth is contemplated as a commonplace material. The glass cloth is formed by a warp and a weft each of which is a bundle of glass fibers. If the glass cloth is cut, entwining of the warp and the weft will disappear so that the glass fibers become unraveled. Recently, the glass fiber bundle itself has become thinner in thickness to cope with the reduction in thickness of the semiconductor device. In addition, twist of glass fibers is weaker so that the glass fibers are more susceptible to unraveling than conventional materials. If the unraveled glass fibers are contacted with or overlie the semiconductor element, it becomes difficult, due to local variations, to form a via on a site of connection between the semiconductor element and the wiring. Moreover, insulation defects are likely to be produced along the glass fibers such that insulation between neighboring pads may not be maintained.

In a semiconductor device in which there is enclosed a semiconductor element, it is essential to provide the semiconductor element on a site as close to the reinforcement material as possible in order to reduce the warping from occurring. However, should there be unraveled individual fibers, it becomes necessary to provide a clearance from the semiconductor element corresponding to the length of the unraveled portion of the individual fibers. As a result, the difference in the thermal expansion coefficient may not be decreased, thus leading to significant substrate warping.

On the other hand, Patent Document 4 discloses changing the cloth direction followed by cutting to assure a more stable severed portion of the glass cloth. However, what Patent Document 4 takes up as a problem is that a cured material not susceptible to unraveling of the glass cloth is used, and that the recessing occurs in the substrate side face on detachment of the glass cloth. There is also no suggestion as to the severed portion being in the vicinity of the semiconductor element.

In view of the above depicted status of the art, it is an object of the present invention to provide a semiconductor device having a semiconductor element enclosed within the interior of a wiring substrate in which the substrate in its entirety is improved in toughness and in which the semiconductor device is thin in thickness while suffering from just little warping.

In a first aspect, a semiconductor device according to the present invention includes an embedding layer having one or a plurality of semiconductor elements embedded therein. The semiconductor device also includes one or a plurality of interconnect layers and one or a plurality of insulation layers on one or both sides of the embedding layer. The embedding layer includes a woven cloth formed by reinforcement fibers. The woven cloth includes an opening on a site of embedding the semiconductor element. The opening is arranged so that the direction of the reinforcement fibers will have a preset angle with respect to a direction of a side of or a tangent to at least a portion of the opening. The preset angle is other than a square angle or a zero angle (parallelism).

The most typical shape of the opening is a rectangle similar in shape to the semiconductor element to be installed. The direction of a side of the rectangle is its longitudinal or transverse direction. If the opening is of such a shape composed of a plurality of rectangles combined together so that their longitudinal directions will be the same and so that their transverse direction will also be the same, it is sufficient that the side direction thereof will form the preset angle with respect to the fiber direction. If the opening is a polygon, it is sufficient that the majority of the sides satisfy the above mentioned condition, that is, that these sides form a preset angle with respect to the direction of the individual fibers of the reinforcement fibers. If the opening is circular or elliptical in shape or of an indefinite shape, there is naturally a tangent to a circumference of the opening that satisfies the above mentioned requirement, irrespectively of the direction of the woven cloth. Even in such case, more or less desirable effects may be expected. The above mentioned shapes may also be combined together. Such opening may be used in case of arranging a plurality of semiconductor elements together.

In a second aspect, a method for manufacturing a semiconductor device having one or a plurality of semiconductor elements embedded therein, according to the present invention, includes forming an embedding layer containing a woven cloth for reinforcement. The woven cloth for reinforcement includes an opening in an area around the semiconductor element. The woven cloth for reinforcement is arranged so that the direction of the reinforcement fibers will have a preset angle with respect to a direction of a side of or a tangent to at least a portion of the opening. The preset angle is other than a square angle or a zero angle (parallelism). The method also includes forming at least one interconnect layer and at least one insulation layer on both sides of the semiconductor device for overlying the semiconductor element and the embedding layer.

In a third aspect, a method for manufacturing a semiconductor device having embedded therein one or a plurality of semiconductor element(s), according to the present invention, includes forming at least one interconnect layer and at least one insulation layer on a support member. The method also includes setting a semiconductor element on the insulation layer, and forming, in an area around the semiconductor element, an embedding layer containing a woven cloth for reinforcement. The woven cloth for reinforcement has an opening, and is arranged so that the direction of the reinforcement fibers will have a preset angle with respect to a direction of a side of or a tangent to at least a portion of the opening. The preset angle is other than a square angle or a zero angle (parallelism). The method further includes forming at least one interconnect layer and at least one insulation layer for overlying the semiconductor element and the embedding layer, and removing the support member.

According to the present invention, the fiber direction of the woven cloth differs from the direction of a side of at least a portion of the opening in which the semiconductor element is loaded, provided that if the opening is circular or elliptical in shape, or indefinite in shape, read a tangential direction for the side direction. The fiber direction differing from the side direction means that the fiber direction is not at right angles with or parallel to the side direction but has a preset angle other than a right angle or a zero angle with respect to the side direction. In this manner, unraveling of fibers, liable to occur at the time of cutting the woven cloth, may effectively be prevented from occurring, while the woven cloth may be drawn closer to the semiconductor element, thus reducing the risk of warping of the semiconductor device.

In addition, a solder material or a resin component is not used in connecting the semiconductor element to the first interconnect, that is, enhancement of the reliability of a connection portion may be achieved by using a plating method for connection. Moreover, by using the vias in the embedding layer, electrodes on both sides may effectively be utilized, such that, by connecting other electronic components or other semiconductor devices of the present invention, it is possible to provide further high-functioning with case.

Furthermore, with the manufacturing method of the present invention, the inventive structure may efficiently be realized by using a support member, so that it becomes easier to cope with reduction in thickness of the semiconductor device.

PREFERRED MODES

Figure 1:
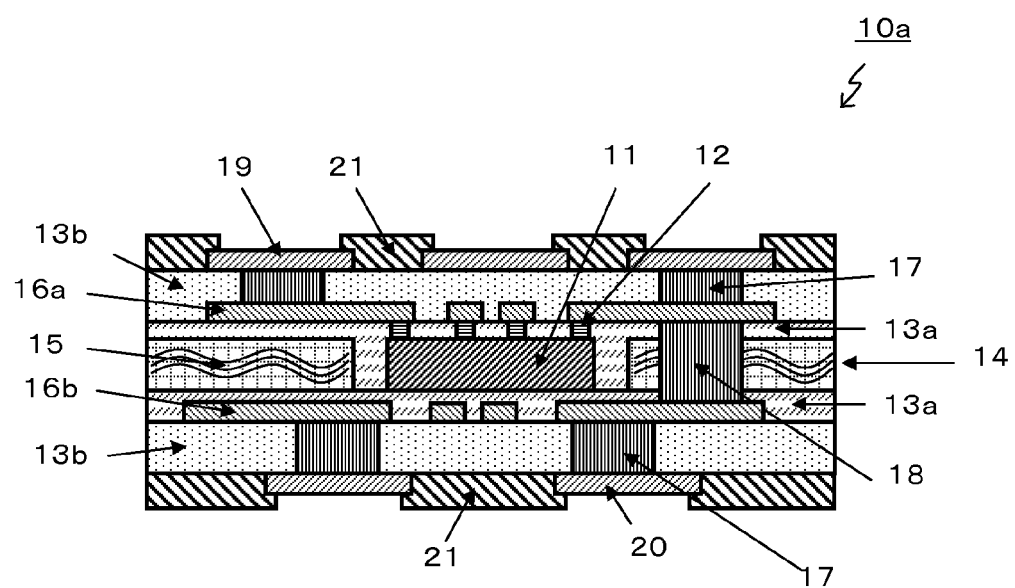
FIG. 1 is a partial cross-sectional view showing a semiconductor device according to an exemplary embodiment 1 of the present invention.

In a first aspect, it is desirable that, for an interval of two neighboring exposed bundles of the fibers, extending in one direction, on at least one side of the opening, there are not larger than five exposed bundles of another fibers, extending in another direction substantially at right angles to the above mentioned one direction, given that the opening is rectangular or polygonal in shape.

It is also desirable that, on at least one side of the opening, an angle a side wall of the opening makes with the reinforcement fibers is 18° to 72°, given that the opening is rectangular or polygonal in shape.

The opening is preferably rectangular in shape. The opening may also be of a shape corresponding to combination of a plurality of rectangles each side of which has the same direction. The opening may also be of a shape of a polygon, or of a shape of a circle or an ellipsis. The opening may also be in a shape of the combination thereof.

The reinforcement fibers may preferably be a glass cloth.

A first via, interconnecting the above mentioned interconnect layers, formed on both sides of the embedding layer, preferably penetrates the embedding layer.

One of the interconnect layers, formed on both sides of the embedding layer, is preferably electrically connected to the semiconductor element via a second via formed on a surface of the semiconductor element.

The reinforcement fibers are preferably contained in at least one of the insulation layers provided on both sides of the embedding layer.

The reinforcement fibers of the insulation layers are preferably a woven cloth or a glass cloth.

The direction of the reinforcement fibers of the insulation layers preferably differs from that of the reinforcement fibers of the embedding layer.

The diameter of the first via is preferably larger than that of the second via.

An electronic component is preferably additionally mounted on a surface of the semiconductor device.

A plurality of the above mentioned semiconductor devices may be disposed in a laminated or stacked fashion.

In a second aspect, the method for manufacturing the semiconductor device according to the present invention preferably includes forming at least one interconnect layer and at least one insulation layer after the step of removing the support member.

Preferably, a first via is formed in the embedding layer in the step of forming the embedding layer containing reinforcement fibers around an area of the semiconductor element.

Preferably, a first via is formed for traversing the embedding layer during the process step of forming at least one interconnect layer and at least one insulation layer overlying the semiconductor element and the embedding layer.

Preferably, the process step of further forming at least one interconnect layer and at least one insulation layer overlying the semiconductor element and the embedding layer includes forming a second via interconnecting the interconnect layer(s) and the semiconductor element.

The method may further include a process step of loading another electronic component.

The method may further include a process step of disposing a plurality of semiconductor devices in a laminated or stacked fashion.

Figure 2A:
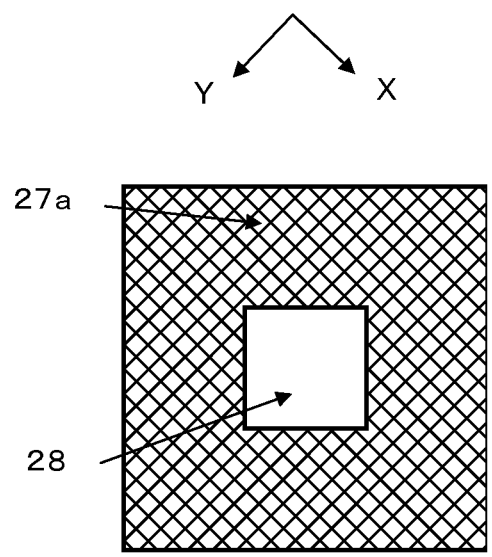
FIGS. 2A and 2B are plan views showing example shapes of openings of the woven cloths used in embedding layers of the semiconductor device according to the exemplary embodiment 1 of the present invention.
Figure 2B:
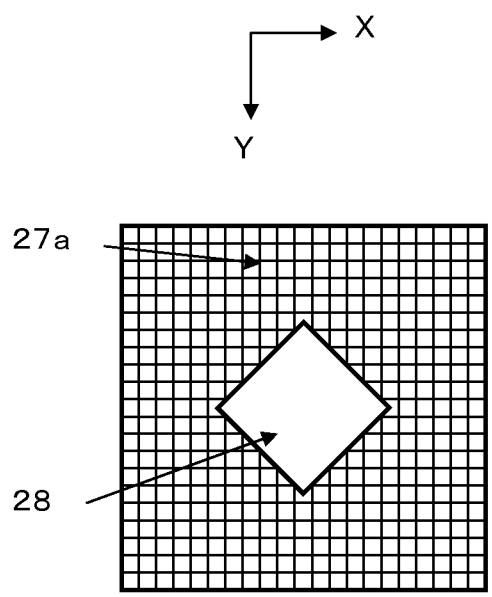

Preferred exemplary embodiments of the present invention will now be described in more detail with reference to the accompanying drawings. Initially, an exemplary embodiment 1 of the present invention will be explained. FIG. 1 is a partial cross-sectional view of a semiconductor device 10a according to the exemplary embodiment 1 of the present invention. FIGS. 2A and 2B are plan views showing the relationship between the direction of individual fibers of reinforcement fibers 27 and an opening 28 in which to embed a semiconductor element 11. Although FIG. 1 shows a four-layered interconnect structure only for illustration, an interconnect structure with two or three layers or an interconnect structure with four or more layers may also be used.

Referring to FIG. 1, a semiconductor device 10a according to an exemplary embodiment 1 includes an embedding layer formed of the semiconductor element 11, insulation layers 13a, 13a and an insulation layer 14 containing a woven cloth 15 as a reinforcement material. On either sides of the embedding layer, there are an interconnect structure composed of interconnect layers 16a, 16b, insulation layers 13b, 13b, a first electrode 19 and a second electrode 20 on both sides. The interconnect layers 16a, 16b are electrically connected to each other by a via 17 and a first via 18 in the embedding layer. The insulation layers 13b, 13b are used between the interconnect layers 16a, 16b. A plurality of second vias 12 are provided on top of a circuit surface of the semiconductor element 11 for connection to the interconnect layer 16a. A solder resist 21 is provided on each surface of the semiconductor device 10a. An opening, in which the semiconductor element 11 is accepted, is formed in a woven cloth containing insulation layer 14 inclusive of the woven cloth 15.

FIG. 1 shows a case where the single semiconductor element 11 is enclosed. This is not restrictive and a plurality of semiconductor elements or other electronic components may also be provided in the embedding layer. It is also possible to provide a plurality of embedding layers so that the semiconductor elements or other electronic components are disposed in respective different embedding layers. The semiconductor device is shown as a four-layered interconnect layer only for illustration and a suitable larger number of interconnect layers may be used.

Returning to FIG. 1, the semiconductor element 11 is connected via a plurality of second vias 12 to the interconnect layer 16a. For the second vias 12, no connection portion by a solder material or a resin component is used. That is, a paste material or an anisotropic electrically conductive material, is not used, but a stable rigid connection member is used. Specifically, the connecting portion is provided by vapor deposition, sputtering, CVD (Chemical Vapor Deposition), ALD (Atomic Layer Deposition), electroless plating or electroplating. As an example manufacturing method, a current supplying layer is provided by vapor deposition, sputtering, CVD (Chemical Vapor Deposition), ALD (Atomic Layer Deposition), electroless plating or electroplating, after which the electroplating or electroless plating is used to a desired film thickness. However, a paste material containing nano-particles may also be used in case a resin component is dissipated, or in case a resin component is sublimated when temperature is applied to approach a sintered body.

The second via 12 is preferably formed to a diameter smaller than that of the via 17 or the first via 18. The reason is that such second via 12 is able to cope with the case where the number of connection pins is increased, and that larger diameters of the via 17 and the first via 18 are necessary to provide for stabilized power 425 supply from the interconnect layers 16a, 16b.

The semiconductor element 11 is embedded in the insulation layer 13a and in the woven cloth containing insulation layer 14. To have the semiconductor element 11 embedded in stability, the semiconductor element 11 is preferably bonded to the insulation layer 13a underlying the semiconductor element 11. In addition, the semiconductor element 11 is preferably finished to a smaller thickness to reduce the thickness of the semiconductor device 10a. In more concrete terms, the semiconductor element 11 is of a thickness not larger than 300 µm, preferably not larger than 150 µm, and more preferably not larger than 100 µm.

In FIG. 1, the semiconductor element 11 is in direct contact with the insulation layer 13a. However, the semiconductor element may be bonded to the insulation layer as necessary. In bonding the semiconductor element 11, if the insulation layer 13a underlying the semiconductor element 11 is in a precuring state or otherwise exhibits a desired bonding performance, the semiconductor element may be bonded on its own. If there lacks the desired bonding performance, or the bonding performance is labile, a liquid adhesive or a sheet-like adhesive may be used. For example, the adhesive is formed of a resin, such as epoxy, epoxy acrylate, urethane acrylate, polyester, phenol or polyimide. In the present exemplary embodiment, the insulation layer 13a is formed of an epoxy resin. Since this resin exhibits no bonding performance, it is bonded to the semiconductor element 11, 50 µm in thickness, using an epoxy adhesive.

The insulation layers 13a, 13b are formed of, for example, an organic material. Examples of the organic material include an epoxy resin, an epoxy acrylate resin, an urethane acrylate resin, a polyester resin, a phenolic resin, a polyimide resin, BCB (Benzocyclobutene), PBO (Polybenzoxazole) and/or a polynorbornene resin. In particular, the polyimide resin and PBO are superior in mechanical properties, such as film strength, modulus of tensile elasticity and breaking elongation, and hence may be highly trustworthy.

An organic material that is photosensitive or non-photosensitive may be used. In case the photosensitive organic material is used, a via hole, used for the via 17 or the first via 18, is formed by photolithography, for example. If a non-photosensitive material or a material that is photosensitive and low in pattern resolution is used, the via hole is formed by laser, dry etching or blasting. By using an organic material for the insulation layers 13a, 13b, it is possible to relax the stress otherwise imposed from the first electrode 19 or the second electrode 20 to the semiconductor device at the time of loading another component on the semiconductor device or of connection to another substrate.

To reduce the difference between the effective thermal expansion coefficient of the semiconductor element 11 and that of the organic material to diminish the warping of the entire semiconductor device, such a material containing a reinforcement material may be used for the insulation layer 13a. However, in case a reinforcement material is used for the insulation layer 13a, the diameter of the second via 12 that may be formed is increased. It is thus selected whether or not the reinforcement material is used as the number of terminals of the embedded semiconductor element 11 or the pitch of the terminals is taken into account.

The organic material used for the insulation layer 13a may be the same as or different from that used for the insulation layer 13b. If the different materials are used, there may be obtained an advantage that, by combining characteristics of the different materials, a low warping structure may be achieved with ease. In case the same material is used, adhesivity between organic materials may be stabilized to improve the insulation reliability as well as to reduce the cost incurred in procuring the materials. In the present exemplary embodiment, epoxy resins are selected for use for both the insulation layers 13a and 13b.

The woven cloth containing insulation layer 14 may be formed of, for example, organic materials used for the above mentioned insulation layers 13a and 13b, and contains the woven cloth 15. The woven cloth 15 not only reduces the difference between the thermal expansion coefficient of the organic material used in the woven cloth containing insulation layer 14 and that of the semiconductor element 11, but also assures high toughness despite the thin thickness. As the material of the woven cloth 15, glass fibers or fibers of organic materials are used. Among the fibers of the organic materials, polyimide, polyamide, PBO (Polybenzoxazole), liquid crystal polymers or fluorine-based resins are desirable in view of toughness and amenability to reducing the thickness. From the standpoint of costs and thermal expansion coefficients, glass fibers are most preferred.

Figure 15:
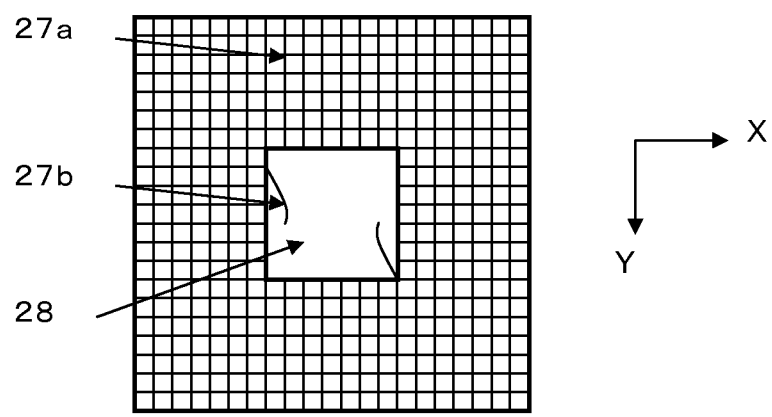
FIG. 15 is a plan view showing an example shape of an opening of a conventional woven cloth.

The woven cloth containing insulation layer 14 is a material containing the woven cloth 15, and hence a via hole is formed therein using a laser, a dry etching method, blasting or the like. FIGS. 2A and 2B show an example structure of the opening according to the present invention, in which the opening 28 is formed in a material containing the woven cloth 15. An example structure of an opening in accordance with a conventional structure is shown in FIG. 15. It is noted that X, Y in the figure denote the direction of a warp yarn and a weft yarn, in which the warp yarn and the weft yarn may be interchanged. The opening 28 may be formed by a press punching, laser cutting, blasting or the like.

Up to now, the material containing a woven cloth is fabricated so that the fibers 27a of the woven cloth (warp yarn and weft yarn) will be aligned with the longitudinal and transverse directions of the material, as shown in FIG. 15. Hence, the opening 28 is also formed along the fiber directions. It is noted that, since the individual fibers, constrained by the warp yarns and the weft yarns, are freed by cutting them at the ends, the individual fibers are unraveled and protruded into the inside of the opening 28. FIG. 15 shows two such unraveled fibers 27b. In particular, in a glass cloth, routinely used as the woven cloth 15, a plurality of glass fibers are bundled together to form each of a warp yarn and a weft yarn, which warp and weft yarns are then entwined together. Since the state of entwining of the warp and weft yarns is lost on cutting the cloth at the end, the glass fibers become unraveled. It is noted that, recently, the glass fiber bundles are becoming thin in diameter and the fiber twist is becoming weak, in order to cope with the reduction in thickness. Hence, the glass fibers tend to be unraveled more readily than the conventional materials.

Moreover, if, in cutting the woven cloth containing insulation layer 14, the organic material that makes up the layer is yet in an insufficiently cured or non-cured state, the force of constraint of glass fiber by the organic material is weak, and hence the glass fibers are more susceptible to unraveling. It is thus not possible to cut the opening 28 in stability. If the glass fibers, thus unraveled, come into contact with or overlie the semiconductor element 11, the second via 12 at the contact portion of the semiconductor element 11 and the interconnect layer 16a becomes difficult to form by machining due to local variations. In addition, insulation troubles tend to be produced due to migration along the glass fibers, with the result that insulation properties between the neighboring pads may not be maintained.

It is now supposed that the glass fibers are disposed overlying the top of the semiconductor element 11, and that, in the step of forming the insulation layers 13a, 13b, it has been decided to select film forming by the press or the laminator. In this case, the force of a pressuring operation is concentrated on a site of contact of the glass fiber with the semiconductor element 11, thus possibly destructing the semiconductor element 11. It is noted that, in a semiconductor device in which the semiconductor element 11 is embedded, it is crucial, in reducing the warping, that the semiconductor element 11 is disposed as close to the woven cloth 15 as a reinforcement material as possible. However, if the opening 28 is formed so as to be apart from unraveled glass fibers, it is necessary to provide a clearance corresponding to the unraveled length of the glass fiber from the opening edge to the end of the semiconductor element 11. As a result, the thermal expansion coefficient difference may not be decreased, and hence the warping of the substrate is increased.

To obviate the unraveling of the glass cloth fibers, the opening is formed, according to the present invention, so that the direction of the end face of the opening 28 is at a preset angle with respect to the fiber direction, as shown in FIGS. 2A and 2B. In particular, the opening 28 is preferably disposed so that, in a distance between neighboring fiber bundles (warp yarns, for example) of the woven cloth, exposed on one side edge (wall surface) of the opening, there is a number equal to not more than five of another fiber bundles (weft yarns, for example) of the woven cloth 15 extending at right angles to the former bundles. A more detailed explanation will be the following. In a glass cloth, a larger number of thin glass fibers are bundled together to form a warp yarn, whilst another large number of thin glass fibers are also bundled together to form a weft yarn. A plurality of the warp yarns and a plurality of the weft yarns are woven together at substantially a right angle (or at a certain angle from the right angle) to form the woven cloth. Suppose now that the angle the weft yarns make with the opening is smaller than the angle the warp yarns make with the opening. In this supposed case, for a distance (interval) from a point of exposure of the sectioned surface of a weft yarn, more correctly that of the fiber bundles of the weft yarn, to a point of exposure of the sectioned surface of the neighboring weft yarn, only five warp yarns, more correctly, only five fiber bundles of the warp yarns at the maximum are exposed. In case the relationship between the warp and weft yarns is reversed, read correspondingly.

In short, if more than five fiber bundles are exposed, unraveling of the fibers will be increased in the same way as in the conventional system, shown in FIG. 15, so that it becomes necessary to provide a larger distance between the semiconductor element 11 and the end of the opening 28. If conversely the number of the fiber bundles is less than five, a sufficiently strong entwining strength between the warp and weft yarns of the woven cloth 15 may be maintained, so that the number of the unraveled fibers is extremely small, such that it becomes possible to set the distance between the semiconductor element 11 and the opening 28 so as to be less than 100 µm.

The angle the fibers 27a of the woven cloth 15 makes with the end of the opening 28 is preferably 18° to 72°, more preferably 30° to 60° and most preferably 40° to 50°. If the angle is less than 18° or more than 72°, the number of the fiber bundles exposed as described above is more than 5. Moreover, the length of the unraveled and protruded fiber 27b becomes longer, thus aggravating the risk of the unraveled fibers contacting with or overlying the semiconductor element 11.

The organic material used for the woven cloth containing insulation layer 14 and the insulation layers 13a, 13b may be formed of different materials or the same material. In case the different materials are used, there is presented an advantage that a low warping structure may be produced by combining the different materials. If conversely the same material is used, adhesivity between the organic materials may be stabilized to improve the insulation reliability as well as to decrease the cost of obtaining the materials. In the present exemplary embodiment, an epoxy resin including a glass cloth (1027 standard) is used as the woven cloth containing insulation layer 14. The state of the opening 28 shown in FIG. 2A is selected, and an angle of approximately 45° is selected as an angle between the fiber 27a of the glass cloth and the opening 28.

The interconnect layers 16a, 16b are formed of copper and are 10 µm in thickness, for example. The interconnect layers 16a, 16b are formed by known interconnect forming methods, for example, a subtractive method, a semi-additive method or a full-additive method. The subtractive method, disclosed in, for example, Patent Document 5 (JP Patent Kokai Publication No. JP-A-10-51105), is such a method including etching a copper foil, provided on a substrate or on a resin, using a resist, opened to a desired pattern, as an etching mask, and removing the resist to produce a desired interconnect pattern.

The semi-additive method, disclosed in, for example, Patent Document 6 (JP Patent Kokai Publication No. JP-A-9-64493), is such a method including forming a power supply layer by electroless plating, sputtering or CVD, forming a resist having an opening of a desired profile, precipitating electroplating within the resist opening and etching the power supply layer after resist removal to yield a desired interconnect pattern.

The full-additive method, disclosed in, for example, Patent Document 7 (JP Patent Kokai Publication No. JP-A-6-334334, is such a method including adsorbing an electroless plating catalyst on a surface of a substrate or a resin, forming a resist pattern, activating the catalyst, as the resist is left as an insulation layer, and allowing metal to be precipitated in an opening in the insulation layer by electroless plating to produce a desired interconnect pattern.

The interconnect layers 16a, 16b, first electrode 19 and the second electrode 20 may include a tight bonding layer against the insulation layers 13a, 13b and the woven cloth containing insulation layer 14. The tight bonding layer may be formed of a material exhibiting tight bonding performance against the materials of the insulation layers 13a, 13b and the woven cloth containing insulation layer 14. Examples of the materials exhibiting tight bonding performance include titanium, tungsten, nickel, tantalum, vanadium, chromium, molybdenum, copper, aluminum or alloys thereof. Among these materials, titanium, tungsten, tantalum, chromium, molybdenum and alloys thereof are desirable and, in particular, titanium, tungsten and alloys thereof are most desirable.

The insulation layers 13a, 13b and the woven cloth containing insulation layer 14 may have roughed surfaces presenting fine crests and recesses. These roughed surfaces present optimum tight bonding performance against copper or aluminum. Sputtering may also be used to develop a higher tight bonding performance.

The thickness of the interconnect layers 16a, 16b is 3 to 25 µm and preferably 5 to 20 µm. If the thickness is less than 3 µm, the interconnect resistance undesirably tends to be high to aggravate electrical characteristics in a power supply circuit of the semiconductor device. An interconnect layer with thickness exceeding 25 µm suffers a defect that marked undulations reflecting the crests and recesses of the interconnect layer are produced on the surface of the insulation layer overlying the interconnect layer to impose restrictions on the number of layers. The interconnect layer with such thickness also suffers a defect that the thickness of the semiconductor device 10a itself is increased to increase the warping of the semiconductor device in its entirety, and that such interconnect layer is difficult to fabricate from process constraints.

The interconnection between the interconnect layers 16a and/or between the interconnect layers 16a and the first electrode 19 is via the vias 17. The interconnection between the interconnect layers 16b and/or between the interconnect layers 16b and the second electrode 20 is similarly via the vias 17. The interconnect layers 16a, 16b are interconnected via the first via 18. The via 17 and the first via 18 may be formed simultaneously with forming the interconnect after providing the via holes as described previously. Or, the interconnect may be formed after having the electrically conductive material embedded in the via holes by electroplating, electroless plating or printing. Metal posts may be formed on the sites that later become the via 17 and the first via 18. The insulation layer 13b, 13a and the insulation layer 14 are then formed, and the metal posts are exposed by polishing for use as the via 17 and the first via 18.

The interconnects of the interconnect layers 16a, 16b are formed of at least one metal selected from the group consisting of, for example, copper, aluminum, nickel, gold and silver. In particular, copper is preferred from the perspective of electrical resistance values and costs. Nickel is effective to prevent interfacial reactions with other materials, such as insulation materials, and may be used as an inductor or resistance interconnection exploiting the characteristics thereof as a magnetic material.

In the example structure, shown in FIG. 1, the interconnect layer 16a is arranged on top of the embedding layer composed of the insulation layer 13a and the woven cloth containing insulation layer 14. The interconnect layer 16b, on the other hand, is embedded in the insulation layer 13a. Except if the interconnect layer 16b is embedded, a volume occupied by the insulation layer 13a on the surface side of the embedding layer provided with the interconnect layer 16b would be larger than a volume occupied by the insulation layer 13a on the surface side of the embedding layer where the insulation layer 16a is provided to which semiconductor element 11 is connected via the second via 12. In such case, the amount of shrinkage would be increased to cause the warping. The example structure is aimed to prevent this from occurring. In short, by having the interconnect layer 16b embedded in the insulation layer 13a, the volume otherwise occupied by the insulation layer 13a is decreased to reduce the shrinkage to control the warping in the two interconnect layer state to higher accuracy. It is noted however that, if the material used as the insulation layer 13a is susceptible to less shrinkage, embedding of the interconnect layer 16b is not mandatory.

The first electrode 19 and the second electrode 20 may be constructed as shown in FIG. 1. An opening of the solder resist 21 may be larger than the size of the first electrode 19 or the second electrode 20 by way of providing what is termed a clearance. In addition, an electrode may further be provided on top of the solder resist. In a structure shown in FIG. 1, the opening is restricted by the solder resist 21 so that, in making connection using a solder material, the solder will be supplied just to the first electrode 19 and the second electrode 20. Since the amount of flow of the solder is restricted by such limitation imposed by the solder resist 21, it becomes possible to provide for a stabilized mounting height at the time of connection of the semiconductor device to a mounting substrate or to other components.

In case the opening for the solder resist 21 is set so as to be larger than the first electrode 19 or the second electrode 20, the solder material acts as a connection surface for the first electrode 19 or the second electrode 20, thus providing for improved connection reliability. In case the electrode is further provided, the solder resist 21 may be effective to relax the stress, thus assuring further improved reliability. It is noted that the first electrode 19 or the second electrode 20 is formed by a plurality of layers laminated together. The surface of the first electrode 19 or the second electrode 20 is to be provided with at least one metal or alloy, selected from the group consisting of copper, aluminum, gold, silver and a solder material, in consideration of the wetting performance of solder balls formed on the surface of the first electrode 19 or the second electrode 20 or connectivity to a bonding wire.

The first electrode 19 or the second electrode 20 is made up, for example, of a copper layer on which a nickel layer and a gold layer are sequentially deposited so that the gold layer will become a top layer. The nickel layer is 3 µm in thickness and the gold layer is 1 µm in thickness. For the first electrode 19 or the second electrode 20, such a structure effective for electrical connection may be selected as appropriate, such that it is not mandatory for the first and second electrodes to be of the same structure. The number or the arrangement of external terminals for the first electrode 19 may differ from that for the second electrode 20 in order to make effective utilization of the external terminals on both sides of the semiconductor device. In this manner, the degree of freedom in making the connections may be improved in case of loading electronic components or semiconductor devices of different outer sizes or providing a structure to be sandwiched between the mounting substrate and other semiconductor devices. It is thus possible to elevate the degree of freedom of connection to assure stabilized connection reliability.

The solder resist 21 may be formed of organic materials shown above as the organic materials used for the insulation layers 13a, 13b. The organic materials used may be photosensitive or non-photosensitive. In case of using the photosensitive organic materials, the opening is formed by photolithography. In case of using a non-photosensitive or photosensitive organic material with only low pattern resolution, the opening is formed using a laser, dry etching or blasting.

The features of the semiconductor device of the exemplary embodiment 1, constructed as described above, will now be described. In the woven cloth containing insulation layer 14, in which the semiconductor element 11 is embedded, the angle the end of the opening 28, in which to set the semiconductor element 11, makes with the fiber 27a of the woven cloth 15 is set in a range from 18° to 72°. By so doing, the risk of elongated lengths of unraveled fibers being formed in the opening 28 may be eliminated to provide for a reduced length of the gap from the semiconductor element 11. On the other hand, the differential between thermal expansion of the insulation layers 13a, 13b and that of the semiconductor element 11 may be reduced, while the substrate may be improved in toughness. In addition, no solder materials or resin components are used in the connection between the semiconductor element and a first interconnection, that is, the connection is by plating. Hence, the connection portions may be improved in reliability to assure high operational reliability of the overall device. Furthermore, the electrodes on both sides of the device may effectively be utilized based on the via formed in the embedding layer.

It is thus possible to provide a semiconductor device thin in thickness, high in density and in connection reliability and suffering only little warping.

Figure 3:
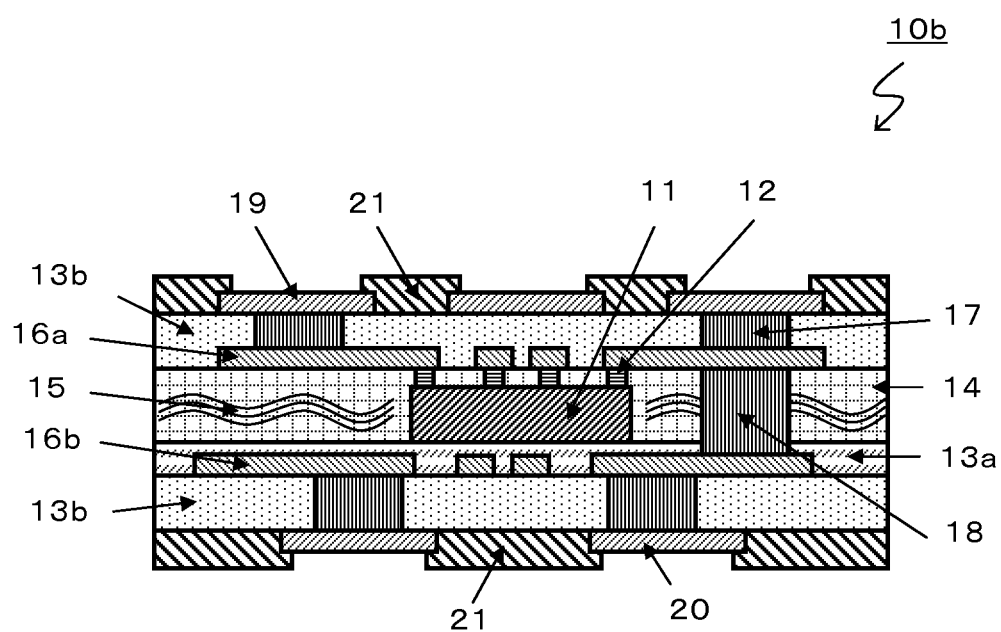
FIG. 3 is a partial cross-sectional view showing a semiconductor device according to a modification of the exemplary embodiment 1 of the present invention.

A modification of the exemplary embodiment 1 of the present invention will now be described. FIG. 3 depicts a partial cross-sectional view showing a semiconductor device 10b according to the modification of the exemplary embodiment 1. The semiconductor device 10b of the present modification differs from the semiconductor device 10a of the exemplary embodiment 1 only as to the fact that the embedding layer for the semiconductor element 11 is formed by just the woven cloth containing insulation layer 14 and by the insulation layer 13a that covers the interconnect layer 16b. The portions of the semiconductor device different from the semiconductor device of the exemplary embodiment 1 will now be explained. The portions not specifically explained remain the same as those of the semiconductor device of the exemplary embodiment 1. Although the first electrode 19 and the second electrode 20 of FIG. 3 are of the same structure as those of FIG. 1, these electrodes may be of the structure as set out in paragraphs 0068 to 0070. In FIG. 3, the semiconductor device has four interconnect layers only for illustration such that the semiconductor device may have two or three or not less than four interconnect layers.

In the modification of the exemplary embodiment 1 of the present invention, the semiconductor element 11 is surrounded by the woven cloth containing insulation layer 14 and by the insulation layer 13a overlying the interconnect layer 16b. The opening 28 is provided, only in the woven cloth 15, at a location where the semiconductor element 11 is provided. In this manner, it is not mandatory to provide the woven cloth containing insulation layer 14 with an opening in register with the semiconductor element, such that it is only sufficient to provide the woven cloth 15 with the opening 28.

In the structure of FIG. 3, the material configuration in having the semiconductor element 11 embedded may be simpler to contribute to cost reduction and to improved yield. In comparison with the semiconductor device of the exemplary embodiment 1, the woven cloth containing insulation layer 14 may be thicker in thickness and hence a woven cloth of a thicker thickness and higher toughness may be provided to achieve higher toughness and low warping. In the exemplary embodiment 1, there may be cases where a reinforcement material, for example, a woven cloth, is contained in the insulation layer 13a disposed on the upper surface of the semiconductor element 11. In the modification of the exemplary embodiment 1, there is no such case of providing the woven cloth 15 on the upper surface of the semiconductor element 11. It is thus possible to reduce the diameter of the second via 12 which is a connection portion to the semiconductor element 11.

The features of the semiconductor device according to the modification of the exemplary embodiment 1 of the present invention, constructed and arranged as described above, will now be described. It is possible to provide a semiconductor device having higher toughness and low cost in addition to having the meritorious effect inherent in the exemplary embodiment 1. It is also possible to realize higher density conformable to reduction in diameter and in pitch, from the aspect ratio of the first via 18, in comparison with the semiconductor device of the exemplary embodiment 1.

Figure 4:
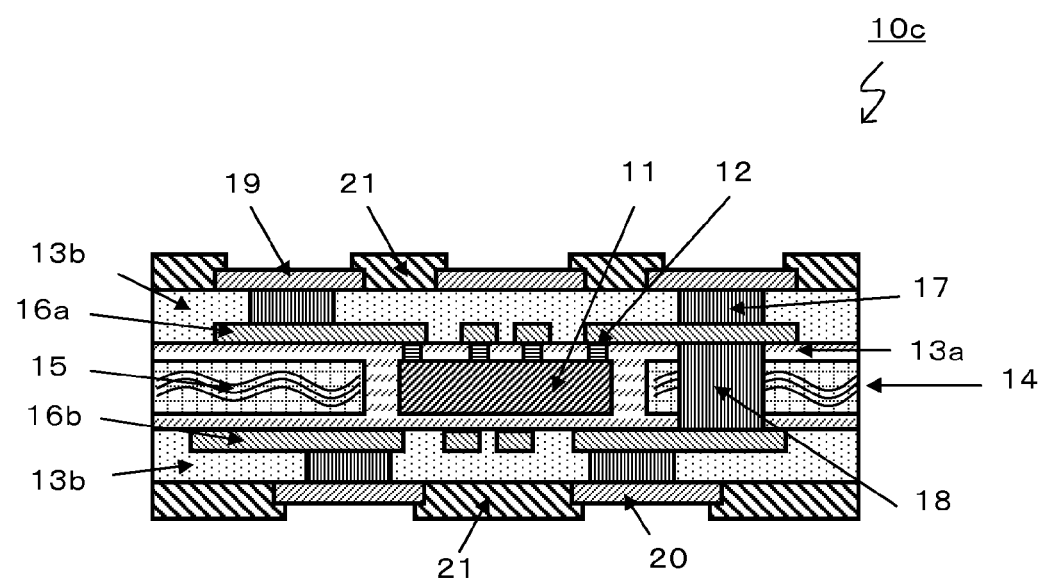
FIG. 4 is a partial cross-sectional view showing a semiconductor device according to an exemplary embodiment 2 of the present invention.

An exemplary embodiment 2 of the present invention will now be described. FIG. 4 depicts a partial cross-sectional view showing a semiconductor device 10c according to the present exemplary embodiment 2. The present semiconductor device differs from the semiconductor device 10a of the exemplary embodiment 1 in that the interconnect layer 16b in the vicinity of the semiconductor element 11 is not embedded in the insulation layer 13a. In the following, only the portions of the semiconductor device that are different from the semiconductor device of the exemplary embodiment 1 will be explained. The portions not specifically explained may remain the same as those of the semiconductor device of the exemplary embodiment 1. Although the first electrode 19 and the second electrode 20 of FIG. 4 are of the same structure as those of FIG. 1, those electrodes may be of the structure as set out in paragraphs 0068 to 0070. In FIG. 4, the semiconductor device has four interconnect layers only for illustration such that it is possible for the semiconductor device to have two or three interconnect layers or not less than four interconnect layers.

By not having the interconnect layer 16b embedded in the insulation layer 13a, it becomes possible to control the thicknesses of the insulation layers 13a, provided on both sides of the semiconductor element 11, to a uniform thickness, and hence to obviate non-evenness of stress applied to the semiconductor element 11. By such stress obviation, it becomes possible to optimally estimate element characteristics varied with the stress applied to the semiconductor element 11 and, as a result, to realize stabilized characteristics of the semiconductor element 11. Moreover, if, in a structure in which the interconnect layer 16b is embedded in the insulation layer 13b, the insulation layer 13b is formed of a material different in material properties from the insulation layer 13a, it becomes possible to exercise control so that displacement due to shrinkage acting on one of both sides will be approximately equal to that applied to the other side, thereby achieving the low warping.

The features of the semiconductor device according to the exemplary embodiment 2 of the present invention, constructed and arranged as described above, will now be described. The present semiconductor device has a meritorious effect of reducing the variations in the characteristics otherwise caused by the stress applied to the semiconductor element 11 and elevating the warp controlling function. In addition, the meritorious effects of the semiconductor device of the exemplary embodiment 1 may be maintained, provided that the effect of warping control resulting from having the interconnect layer 16b of the semiconductor device of the exemplary embodiment 1 embedded in the insulation layer 13a is excluded.

Figure 5:
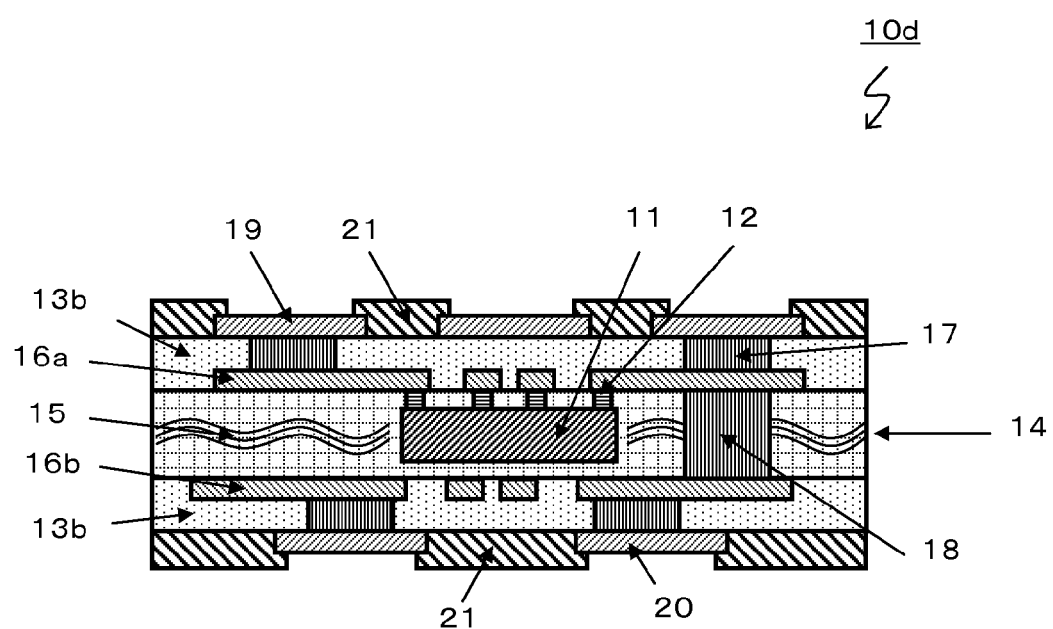
FIG. 5 is a partial cross-sectional view showing a semiconductor device according to a modification of the exemplary embodiment 2 of the present invention.

A modification of the exemplary embodiment 2 of the present invention will now be described. FIG. 5 depicts a partial cross-sectional view showing a semiconductor device 10d according to a modification of the exemplary embodiment 2. The present modification differs from the semiconductor device of the exemplary embodiment 1 in that the interconnect layer 16b in the vicinity of the semiconductor element 11 is not embedded in the insulation layer 13a. The present modification also differs from the semiconductor device of the exemplary embodiment 2 in that only the woven cloth containing insulation layer 14 composes the layer embedding the semiconductor element 11. In the following, only the portions of the semiconductor device that are different from the semiconductor devices of the exemplary embodiments 1 and 2 will be explained. The portions not specifically explained may remain the same as those of the semiconductor devices of the exemplary embodiments 1 and 2. FIG. 5 shows a structure with four layers of interconnects only for illustration such that a structure with two or three layers of interconnects or a structure with four or more layers of interconnects may also be used.

With the structure of FIG. 5, the material-related configuration in embedding the semiconductor element 11 may be simplified to reduce the cost or to improve the yield. Moreover, in comparison with the semiconductor device according to the exemplary embodiment 2, the woven cloth containing insulation layer 14 may be thicker in thickness. Hence, a woven cloth thicker in thickness and higher in toughness may be used, thus achieving higher toughness and lower warping. In addition, since the woven cloth 15 is not arranged on the upper surface of the semiconductor element 11, the diameter of the second via 12 as a connection part to the semiconductor element 11 may be reduced. Furthermore, if, in a structure in which the interconnect layer 16b is embedded in the insulation layer 13b, the insulation layer 13b used is formed of a material having characteristics different from those of the material of the insulation layer 13a, it becomes possible to exercise control so that displacement due to shrinkage acting on one of both sides will be approximately equal to that acting on the other side, thereby achieving a low warping.

The features of the semiconductor device according to the modification of the exemplary embodiment 2, constructed and arranged as described above, will now be described. It is possible to implement a semiconductor device which, in addition to having the meritorious effect of the semiconductor device according to the exemplary embodiment 2, is high in toughness and low in cost. In addition, it is possible to implement a high density semiconductor device that is able to cope with a smaller diameter and a narrower pitch more satisfactorily than the semiconductor device of the exemplary embodiment 1 from the aspect ratio of the first via 18.

Figure 6:
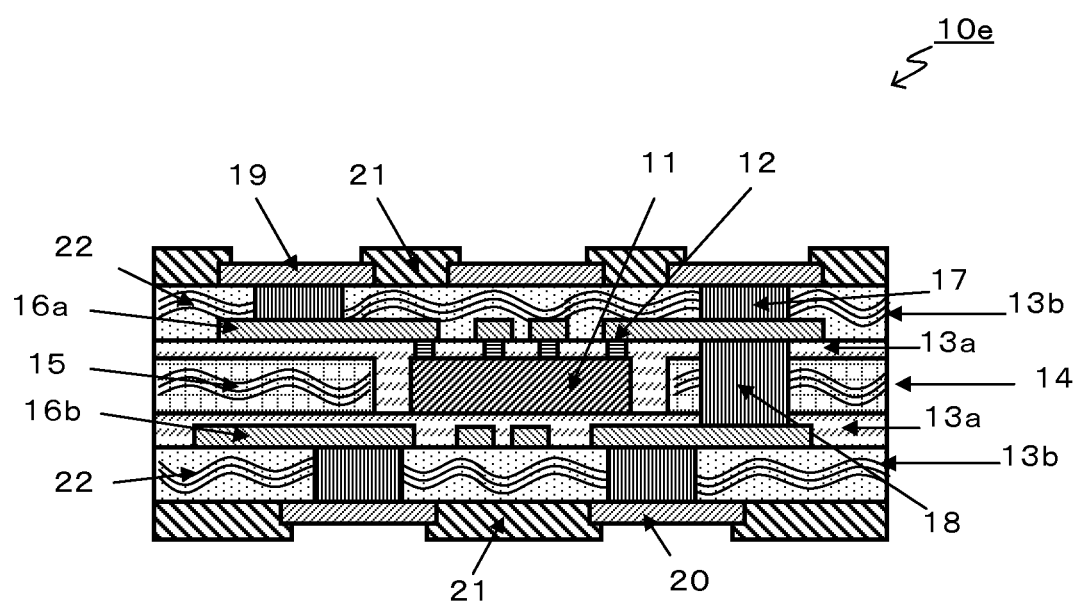
FIG. 6 is a partial cross-sectional view showing a semiconductor device according to an exemplary embodiment 3 of the present invention.

An exemplary embodiment 3 of the present invention will now be described. FIG. 6 depicts a partial cross-sectional view showing a semiconductor device 10e according to the exemplary embodiment 3. The semiconductor device 10e of the present exemplary embodiment 3 differs from the semiconductor devices of the exemplary embodiment 1, its modification, exemplary embodiment 2 and its modification in having a woven cloth 22 in each of two insulation layers 13b of the semiconductor device. Although FIG. 6 uses the structure of the exemplary embodiment 1, it is possible to use the structure of the modification of the exemplary embodiment 1, that of the exemplary embodiment 2 or that of the modification of the exemplary embodiment 2. In the following, the portions of the present semiconductor device different from the semiconductor devices according to the exemplary embodiment 1, modification of the exemplary embodiment 1, exemplary embodiment 2 or the modification of the exemplary embodiment 2 will be described. It is understood that those portions not specifically stated may be of the same structure as that of the exemplary embodiment 1, modification of the exemplary embodiment 1, that of the exemplary embodiment 2 or that of the modification of the exemplary embodiment 2. FIG. 6 shows a structure with four layers of interconnects only for illustration such that a structure with two or three layers of interconnects or a structure with four or more layers of interconnects may also be used.

By using a material containing the woven cloth 22 in the insulation layer 13b, the semiconductor device in its entirety may further be improved in toughness. The insulation layer 13b containing the woven cloth 22 not only provides a planar support for the external stress, but also protects a semiconductor element 10e against impacts. Since the semiconductor device is improved in toughness, it is possible to improve the handling performance as well as productivity.

Since the example structure with four layers is shown in FIG. 6, a single insulation layer 13b is provided on each side of the semiconductor element. If a plurality of insulation layers 13b is provided on one or both sides of the semiconductor element 10e, it is desirable, for improving the toughness of the semiconductor element, that the woven cloth 22 is contained in at least the insulation layer 13b constituting the outermost layer. Each of the insulation layers 13b may also contain the woven cloth 22.

The insulation layer 13b may be formed of the organic materials shown above as the organic materials used in the insulation layers 13a, 13b of the exemplary embodiment 1, and may contain the woven cloth 22 as a reinforcement material. This woven cloth 22 is used at least in the insulation layer 13b constituting the outermost layer, so that toughness may be maintained by the woven cloth 22 even if the woven cloth is thin in thickness. Since the woven cloth elevates the toughness of the semiconductor device in its entirety, the warping that may occur in the vicinity of the semiconductor element 11 may be reduced, while the warping of the semiconductor device in its entirety may also be reduced. The woven cloth 22 may be formed of, for example, glass fibers or fibers of an organic material. As the fibers of the organic material, polyimide, polyamide, PBO (Polybenzoxazole), liquid crystal polymers or fluorine polymers are desirable from the perspective of toughness or thin thickness. The glass fibers are more desirable from the perspective of costs and thermal expansion coefficients. In case the insulation layer 13b contains the woven cloth 22, the via hole is formed using a laser, dry etching or blasting.

The features of the semiconductor device according to the exemplary embodiment 3, constructed and arranged as described above, will now be described. In addition to having the meritorious effects inherent in the semiconductor devices of the exemplary embodiment 1, its modification, exemplary embodiment 2 and its modification, the semiconductor device according to the exemplary embodiment 3 may be improved in toughness in its entirety. Hence, low warping may be achieved, while reliability against impacts may also be improved. Since the handling performance and productivity may be improved, it is possible to decrease process costs.

Figure 7:
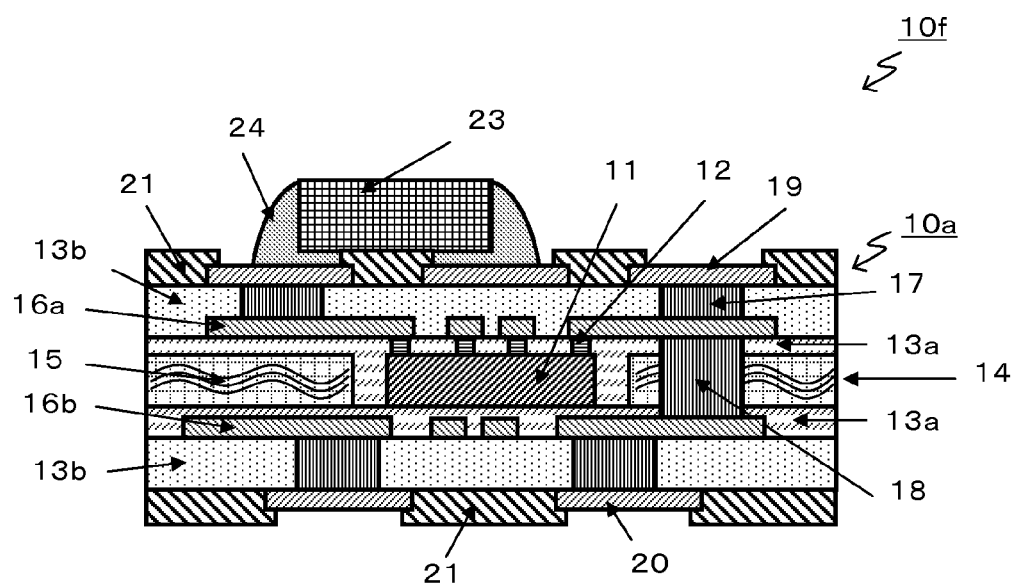
FIG. 7 is a partial cross-sectional view showing a semiconductor device according to an exemplary embodiment 4 of the present invention.

An exemplary embodiment 4 of the present invention will now be described. FIG. 7 depicts a partial cross-sectional view showing a semiconductor element 10f according to the present exemplary embodiment 4. The present exemplary embodiment differs from the semiconductor device 10a of the exemplary embodiment 1 in that an electronic component is loaded on the semiconductor device 10a. In the following, only the portions different from the semiconductor device according to the exemplary embodiment 1 will be explained. It is understood that those portions that are not specifically stated remain unchanged from the corresponding portions of the semiconductor device of the exemplary embodiment 1. Although the first electrode 19 and the second electrode 20 of FIG. 7 are of the same structure as those of FIG. 1, these electrodes may be of the structure as set out in paragraphs 0068 to 0070.

Although the semiconductor device 10a according to the exemplary embodiment 1 is here used as an example, the semiconductor device 10b according to its modification, the semiconductor device 10c according to the exemplary embodiment 2, the semiconductor device 10d according to its modification or the semiconductor device 10e according to the exemplary embodiment 3 may also be so used. The number of the interconnect layers or the combination of the insulation layers may be the same as those stated in the respective exemplary embodiments.

An electronic component 23 is connected to a first electrode 19 by a connecting portion 24, such as a solder material, an electrically conductive paste, an anisotropic electrically conductive material, wire bonding, ribbon bonding or tape bonding. Although FIG. 7 shows that the electronic component is connected to the first electrode 19, it may also be connected to the second electrode 20, or to both the first and second electrodes. The electronic component 23 may be a capacitor, a resistor, an inductor, a semiconductor element, an MEMS, an optical component or a sensor.

The features of the semiconductor device according to the exemplary embodiment 4, constructed and arranged as described above, will now be described. In addition to having the meritorious effects inherent in the semiconductor devices of the exemplary embodiment 1, its modification, exemplary embodiment 2, its modification, and the exemplary embodiment 3, it is possible to implement the semiconductor device according to the exemplary embodiment 4 with expanded functions and stabilized operation.

Figure 8:
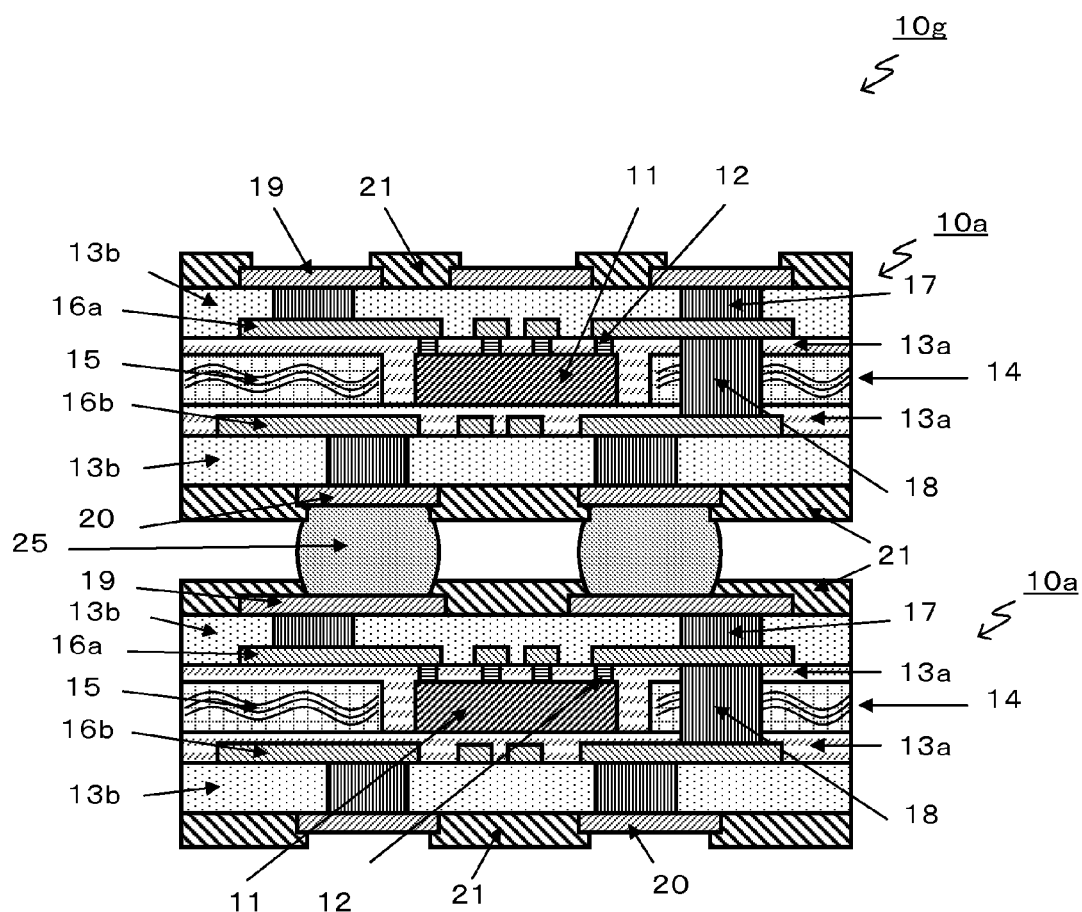
FIG. 8 is a partial cross-sectional view showing a semiconductor device according to an exemplary embodiment 5 of the present invention.

An exemplary embodiment 5 of the present invention will now be described. FIG. 8 depicts a partial cross-sectional view showing a semiconductor device 10g according to the exemplary embodiment 5. The semiconductor device 10g differs from the semiconductor device 10a of the exemplary embodiment 1 in that a plurality of the semiconductor devices 10a are laminated and connected together. In the following, only the portions different from the exemplary embodiment 1 will be explained. It is understood that those portions that are not specifically stated are the same as the semiconductor device according to the exemplary embodiment 1. Although the first electrode 19 and the second electrode 20 are the same in structure to those shown in FIG. 1, they may also be the same in structure as set out in paragraphs 0068 to 0070. Although the semiconductor device 10a according to the exemplary embodiment 1 is here used as an example, the semiconductor device 10b according to its modification, the semiconductor device 10c according to the exemplary embodiment 2, the semiconductor device 10d according to its modification or the semiconductor device 10e according to the exemplary embodiment 3 may also be so used. The number of the interconnect layers or the combination of the insulation layers may be the same as those stated in the respective exemplary embodiments.

FIG. 8 shows an example of laminating two semiconductor devices only for illustration such that any desired number of semiconductor devices may be so laminated. The semiconductor devices 10a to 10e of the exemplary embodiments 1 to 3 may be combined together and laminated as semiconductor devices.

In FIG. 8, two semiconductor devices 10a are laminated together as connection parts 25, 25 are provided between a first electrode 19 and a second electrode 20 provided facing each other. The connection parts 25, 25 are connected by use of a solder material, an electrically conductive paste, an anisotropic electrically conductive material, stud bumps or indium. The electrodes used for connection are not limited to the first electrode 19 or to the second electrode 20 such that connection by the first electrode 19 and the first electrode 19 or that by the second electrode 20 and the second electrode 20 may selectively be used. The electronic component 23 may also be connected as in the case of the semiconductor device according to the exemplary embodiment 4.

The features of the semiconductor device according to the exemplary embodiment 5, constructed and arranged as described above, will now be described. In addition to having the meritorious effects inherent in the semiconductor devices of the exemplary embodiment 1, its modification, exemplary embodiment 2, its modification, exemplary embodiment 3 and the exemplary embodiment 4, it is possible to implement the semiconductor device according to the exemplary embodiment 5 with expanded functions and stabilized operation in a configuration with enhanced degree of freedom of designing.

In each of the above mentioned exemplary embodiments, there may be provided capacitors on desired sites of laminated circuits each composed of the semiconductor element 11, interconnect layers 16a, 16b, first electrode 19 and the second electrode 20. These capacitors perform the role of circuit noise filters or decoupling. The dielectric materials, composing the capacitors, are preferably metal oxides, such as titanium oxide, tantalum oxide, $Al_2O_3$, $SiO_2$, $ZrO_2$, $HfO_2$ or $Nb_2O_5$, perovskite materials, such as BST ($Ba_xSr_{1-x}TiO_3$), PZT ($PbZr_xTi_{1-x}O_3$) or PLZT ($Pb_{1-y}La_yZr_xTi_{1-x}O_3$) or Bi-based layer or laminar compounds, such as $SrBi_2Ta_2O_9$, where $0 \leq x \leq 1$ and $0 < y < 1$. As a dielectric material that composes the capacitor, an organic material mixed with an inorganic material or a magnetic material may be used.

There may be provided a capacitor in one or a plurality of the insulation layers 13a, insulation layers 13b and the woven cloth containing insulation layers 14. The capacitor is formed of a material with a dielectric constant not lower than 9, and may perform the role of a circuit noise filter or a decoupling means provided that a counter electrode is provided at a desired location of an interconnect layer formed above or below the capacitor. The dielectric materials, composing the capacitor, is preferably metal oxides, such as $Al_2O_3$, $ZrO_2$, $HfO_2$ or $Nb_2O_5$, perovskite materials, such as BST ($Ba_xSr_{1-x}TiO_3$), PZT ($PbZr_xTi_{1-x}O_3$) or PLZT ($Pb_{1-y}La_yZr_xTi_{1-x}O_3$), or Bi-based layer or laminar compounds, such as $SrBi_2Ta_2O_9$, where $0 \leq x \leq 1$ and $0 < y < 1$. As a dielectric material that composes the capacitor, an organic material mixed with an inorganic material or a magnetic material may be used.

Preferred exemplary embodiments of the method for manufacturing a semiconductor device of the present invention will now be explained in detail with reference to the drawings. Initially, the method for manufacturing the semiconductor device according to the exemplary embodiment 1 of the present invention will be explained. FIGS. 9A to 9E are partial cross-sectional views showing the method for manufacturing the semiconductor device 10a according to the exemplary embodiment 1 of the present invention. Note that rinsing or heat treatment may optionally be carried out in each process step.

Initially, the interconnect layer 16b is formed on a support member 26. For the support member 26, surface wet rinsing, dry rinsing, planarizing or roughening is carried out as necessary. It is preferred that the support member 26 is an electrically conductive material or a material carrying an electrically conductive film on its surface and exhibiting moderate toughness. Hence, the support member may be formed of a semiconductor wafer material, such as silicon, sapphire or GaAs, metal, quartz, glass, ceramics or a print plate. The electrically conductive material is one, or more of metals, semiconductor materials and organic materials exhibiting the desired degree of electrical conductivity. In the present exemplary embodiment, a copper plate, 0.25 mm thickness, was used as the support plate. The interconnect layer 16b is formed of, for example, copper, and has a thickness of, for example, 10 μm. The interconnect layer 16b is formed by an interconnect forming method, such as a subtractive method, a semi-additive method or a full-additive method. In forming a fine interconnection, the semi-additive method is selected, and a current supplying layer is formed by a sputtering method, an electroless plating method, a CVD method or by an aerosol method. In the present exemplary embodiment, a copper plate was used as a current supplying layer. Using a dry film resist, Ni and Cu were deposited in this order by electroplating. Ni was deposited to a thickness of 3 μm and Cu was deposited to a thickness of 10 μm.

Figure 9A:
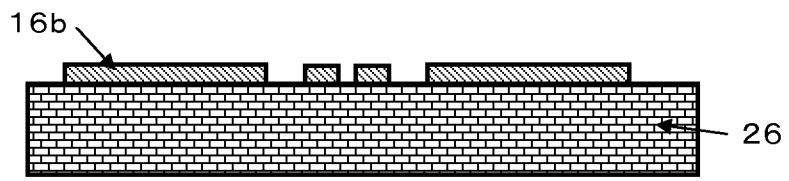
FIGS. 9A to 9E are partial cross-sectional views for illustrating a manufacturing method for the semiconductor device according to the exemplary embodiment 1 of the present invention.
Figure 9B:
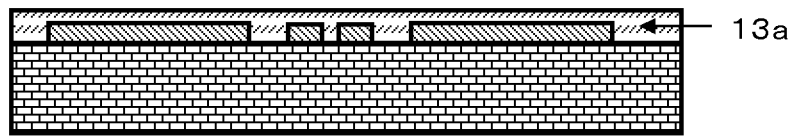

Then, as shown in FIG. 9B, an insulation layer 13a was formed to overlie the interconnect layer 16b. The insulation layer 13a may be formed from e.g., an organic material shown above as organic materials used for the insulation layers 13a and 13b in the exemplary embodiment 1. The insulation layer 13a may be formed of a reinforcement fiber containing material. If the insulation layer 13a is formed of a liquid organic material, it is formed by spin coating, curtain coating, die coating, spraying or printing. If the insulation layer is formed of a film-shaped organic material, it may be formed by a laminating method or a pressuring method each added or not added by a vacuum state. In the present exemplary embodiment, a sheet-shaped epoxy resin, 20 μm thickness, was used, and lamination was by a vacuum laminator.

Figure 9C:
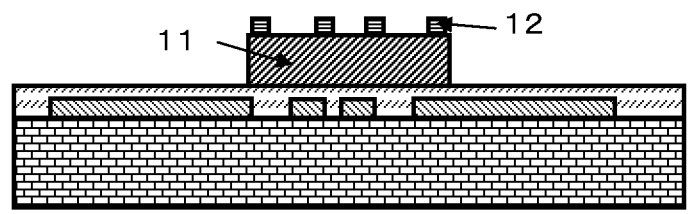

Then, as shown in FIG. 9C, a semiconductor element 11 is set on the insulation layer 13a. In bonding the semiconductor element 11, if the insulation layer 13a is yet to be cured and the semiconductor element thus possesses a desired adhesive function, it may directly be used for bonding. If the semiconductor element is lacking in such function or labile, a liquid adhesive or a sheet-shaped adhesive may be used. The adhesive used may, for example, be an epoxy resin, an epoxy acrylate resin, a urethane acrylate resin, a polyester resin, a phenolic resin or a polyimide resin. The semiconductor element 11 may be provided with a plurality of second vias 12. For the second vias 12, connection by solder materials or resin components, that is, by paste materials or anisotropic electrically conductive materials, is not carried out, and a connection portion exhibiting toughness in stability is provided. Specifically, the connection portion is provided by vapor deposition, sputtering, CVD (Chemical Vapor Deposition), ALD (Atomic Layer Deposition), electroless plating or by electroplating. An example manufacturing method is forming a current supplying layer with vapor deposition, sputtering, CVD, ALD or electroless plating followed by providing a desired film thickness by electroplating or electroless plating, by way of carrying out the semi-additive method. However, a paste material containing nano-particles may also be used in case a resin component is dissipated, or in case a resin component is sublimated when temperature is applied to form a sintered body.

It is desirable that the semiconductor element 11 is finished to a thin thickness to reduce the thickness of the semiconductor device 10a. In more specific terms, the semiconductor element 11 is of a thickness not greater than 300 μm, preferably not greater than 150 μm and more preferably not greater than 100 μm. In the present exemplary embodiment, the semiconductor element 11, 50 μm in thickness, provided with a copper post 20 μm in height, as each second via 12, was installed on the as-cured insulation layer 13a and bonded in position using an epoxy resin to 20 μm in thickness.

Figure 9D:
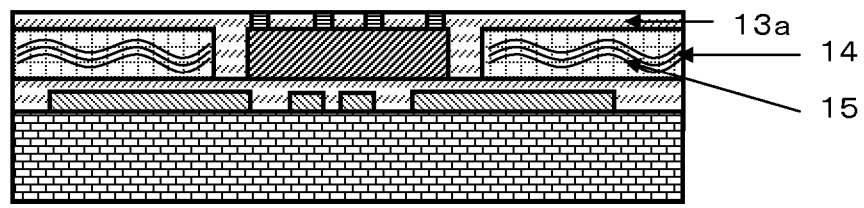

Then, as shown in FIG. 9D, a woven cloth containing insulation layer 14, containing a woven cloth 15, was deposited, and an insulation layer 13a was deposited thereon to form an embedding layer. The woven cloth containing insulation layer 14 is formed of, for example, an organic material, which may be the same organic material as that shown above for use as the insulation layers 13a, 13b of the exemplary embodiment 1. The woven cloth 15 is used as a reinforcement material.

The woven cloth 15 is useful not only for reducing the thermal expansion coefficient differential between the organic material used for the woven cloth containing insulation layer 14 and the semiconductor element 11, but also for imparting toughness despite the reduced thickness. Examples of the materials for the woven cloth 15 include glass fibers and fibers of the organic materials. Among the fibers of the organic materials, polyimide, polyamide, PBO (Polybenzoazole), liquid crystal polymers and fluorine based resins are more preferred in toughness or thin thickness, while glass fibers are more desirable in connection with costs and the thermal expansion coefficient. Since the woven cloth containing insulation layer 14 contains the woven cloth 15, the via hole is formed using a laser, dry etching or blasting. An as-cured material or a non-cured material may be used as the woven cloth containing insulation layer 14.

In the course of this process, the insulation layer 13a, formed on the side of the woven cloth containing insulation layer 14 opposite to the support member 26, may be formed of a material which is the same as the insulation material of the woven cloth containing insulation layer 14 to the exclusion of the woven cloth 15. Or, the semiconductor element 11 may be covered just by the woven cloth containing insulation layer 14, by exploiting the fluidity of the woven cloth containing insulation layer 14.

In bonding the woven cloth containing insulation layer 14 and the insulation layer 13a to each other, if the insulation layer 13a is yet to be cured and thus possesses a desired adhesive function, the two layers may directly be bonded to each other. If the insulation layer 13a is lacking in such function or labile, a liquid adhesive or a sheet-shaped adhesive may be used. If the material of the woven cloth containing insulation layer 14 itself exhibits adhesivity, the layer may be bonded on its own. In laminating the insulation layer 13a, the method stated in FIG. 9B is repeated. In the present exemplary embodiment, a pre-preg material, 50 μm thickness, obtained on impregnating a glass cloth with an epoxy resin, was used as the woven cloth containing insulation layer 14, and lamination was carried out using a vacuum laminator. The insulation layer 13a on top of the woven cloth containing insulation layer 14 was laminated by a vacuum laminator using a sheet-like epoxy resin 20 μm thickness. The heat treatment of the curing process was carried out on the insulation layer 13*a* combined with the woven cloth containing insulation layer 14.

An opening in the woven cloth containing insulation layer 14 or in the woven cloth 15 was formed by laser working, punch press working, dicing, water-cutting, blasting, routing or a drill. The opening may also be formed by masking with a metal film or a resist material. Note that the opening is formed so that the direction of the side of the opening will satisfy a preset relationship with respect to the direction of individual fibers of the woven cloth 15, as set out above.

Figure 9E:
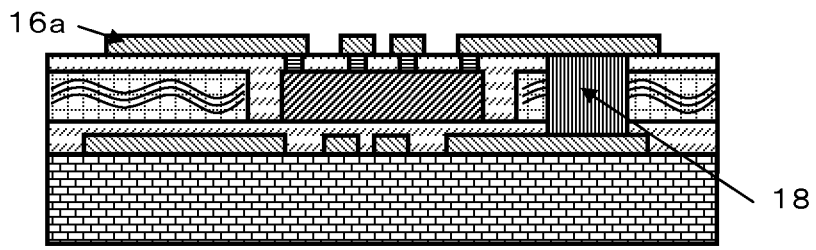

Then, as shown in FIG. 9E, the first via 18 and the interconnect layer 16*a* are formed. The opening of the first via 18 may initially be formed by a laser, a dry etching method or blasting, and the first via may then be formed in the course of forming the interconnect layer 16*a*. Or, the via hole may initially be charged with an electrically conductive material by electroplating, electroless plating or printing, after which an interconnect layer 16*a* may be formed. Alternatively, a metal post may be formed by plating or printing in a portion which is to be the first via 18. After forming the insulation layer 13*a* and the woven cloth containing insulation layer 14, the portion of the so formed layer in register with the via is removed by buffing, dry etching, CMP, polishing or lapping to expose the metal post to form the first via 18. Although the hole of the first via 18 is shown in FIGS. 9A-9E by a vertically extending wall section, it may also be tapered.

The interconnect layer 16*a* is formed so as to be connected to the second via 12. This second via 12 has its connection portion connected as shown in FIG. 9C. In case the second via 12 is longer in length than the finished film thickness of the insulation layer 13*a*, the second via 12 is exposed, before forming the interconnect layer 16*a*, by buffing, dry etching, CMP, polishing or lapping. In case the second via 12 is lesser in length than the insulation layer 13*a*, the opening is formed by a laser, dry etching or blasting, and electrical conduction is established in the process step of forming the interconnect layer 16*a*, which interconnect layer 16*a* may be formed by the interconnect technique as indicated in FIG. 9A.

In the present exemplary embodiment, a hole part of the first via 18 was formed by lasing and the inside of the hole was charged with copper plating as the current was supplied from a copper plate of the support member. The second via 12 was already formed as a copper post 30 μm in height, as set out above, and a connection point was exposed by buffing the surface of the insulation layer 13*a* overlying the second via 12. The interconnect layer 16*a* was formed to a film thickness of 10 μm, using the semi-additive method. A film obtained on sputtering was used as a current supplying layer.

Figure 10F:
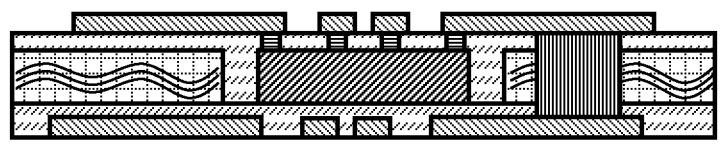
FIGS. 10F to 10I are partial cross-sectional views for illustrating a manufacturing method for the semiconductor device according to the exemplary embodiment 1 of the present invention.

The support member 26 was then removed, as shown in FIG. 10F. For removing the support member 26, wet etching, dry etching or polishing was used either alone or in combination. If the support member 26 is provided with a peel-off portion of low adhesivity, the support member 26 may be removed by peel-off. After peel-off, processing by wet etching, dry etching or polishing may be carried out either alone or in combination. In the present invention, the copper plate was removed by wet etching. At this time, Ni was used as etching barrier for copper plate etching. Ni was ultimately removed by wet etching.

Figure 10G:
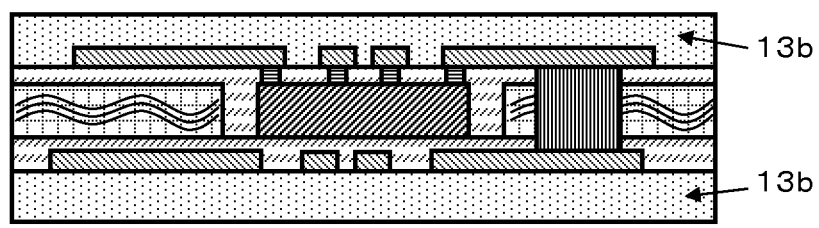

The insulation layers 13*b* were then formed on both sides, as shown in FIG. 10G. In forming the insulation layers 13*b*, the method shown in FIG. 9B may be used. After depositing the layers, heat treatment may be carried out to provide the insulation layers. The insulation layers may be formed on both sides simultaneously or on one side at a time and thereafter on the other side. In the present exemplary embodiment, an epoxy resin sheet, 50 μm in thickness, was deposited simultaneously on each of both sides using a vacuum laminator.

Figure 10H:
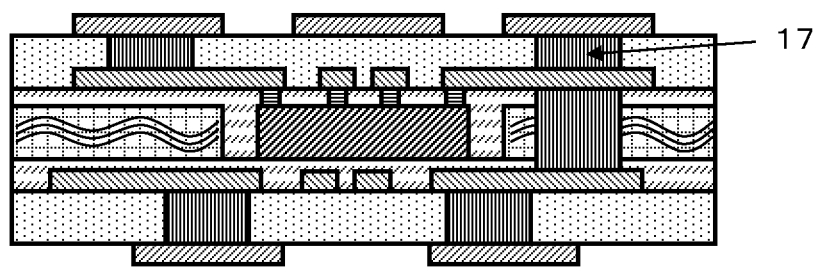

The via 17 and the interconnect layers 16*a*, 16*b* were then formed, as shown in FIG. 10H. In case the photosensitive organic material is used as the insulation layers 13*b*, the insulation layers 13*b* are formed by spin coating, lamination, press-working or printing, after which the hole of the via 17 is bored e.g., by photolithography. In case a non-photosensitive organic material or an organic material that is photosensitive and low in pattern resolution is used, the hole of the via 17 is bored using lasing, dry etching or blasting. In forming the via 17, a metal post is formed by plating or printing on a site which is to become the via. The insulation layer 13*b* is then formed, and the portion of the so formed layer in register with the via is removed by dry etching, CMP, polishing or lapping to expose the metal post as the via 17. In FIG. 10, the hole of the via 17 is shown as a longitudinal wall section, however, this wall section may also be tapered. By repeating the process steps from FIGS. 10F to 10H, a semiconductor device having a desired number of interconnect layers may be provided. After forming desired interconnect layers, the first and second electrodes 19, 20 are formed.

Figure 10I:
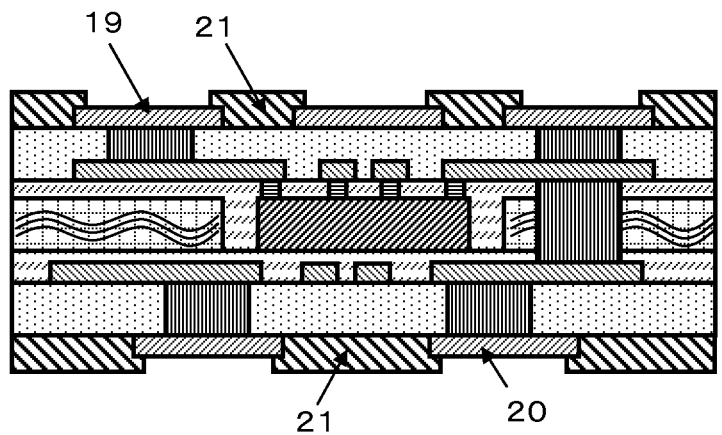

A solder resist 21 is then formed on each of uppermost and lowermost layers, as shown in FIG. 10I. The solder resist 21 is formed in a hole that delimits a portion which later becomes the first electrode 19 or the second electrode 20. In case the hole of the solder resist 21 is set so as to be larger than the first electrode 19 or the second electrode 20, the solder material in contact with the sidewall section of the first electrode 19 or the second electrode 20 may provide a connection surface, thus assuring improved connection reliability. In case an electrode is further provided, the solder resist 21 may be used for stress relaxing to provide for further improved reliability.

Each of the first electrode 19 and the second electrode 20 is composed of a plurality of layers. For example, at least one metal or alloy selected from the group consisting of copper, aluminum, gold, silver and the solder material may be provided on the surface of the first electrode 19 and the second electrode 20. At this time, it is necessary to take account of wettability of the solder balls formed on the surface of the first electrode 19 or the second electrode 20 and connectivity to the bonding wire. The first electrode 19 or the second electrode 20 may be of a structure that may be effective for connection such that it is unnecessary for the electrodes to be of the same structure.

The solder resist 21 is formed of, for example, an organic material, which organic material may be any of those materials as typified by the organic materials used for the insulation layers 13*a*, 13*b* of the exemplary embodiment 1. The organic materials may be photosensitive or non-photosensitive. If the photosensitive organic material is used, an opening may be formed e.g., by photolithography. If the non-photosensitive material or the photosensitive material of low pattern resolution is used, the opening is bored by lasing, dry etching or blasting.

In the present exemplary embodiment, an opening is formed using the photosensitive solder resist 21. A Ni layer and a gold layer were deposited on a Cu layer, by electroless plating, as the first electrode 19 or the second electrode 20, so that the Au layer will form a top layer. The Ni layer was 3 μm in thickness, whilst the Au layer was 1 μm in thickness.

In the method for manufacturing the semiconductor device according to the exemplary embodiment of the present invention, the semiconductor device according to the exemplary embodiment may be formed efficiently. The insulation layer 13a provided on a surface of the woven cloth containing insulation layer 14 opposite to its surface provided with the support member 26 may be of the same material as that of the woven cloth containing insulation layer 14 to the exclusion of the woven cloth 15. Or, the insulation layer 13a on a surface of the woven cloth containing insulation layer 14 opposite to its surface provided with the support member 26 is formed just by the woven cloth containing insulation layer 14. In these cases, the resin material is allowed to flow at the time of lamination so that the semiconductor element will be covered up by the resin material. By so doing, a semiconductor device as the modification of the exemplary embodiment 1 may be fabricated efficiently. Moreover, by using a material comprised of the insulation layer 13b containing a woven cloth 22, it is possible to efficiently form a semiconductor device according to the exemplary embodiment 3. Furthermore, by having electronic components loaded or by having a plurality of semiconductor devices laminated together, a semiconductor device according to an exemplary embodiment 4 or 5 may be fabricated efficiently.

In FIGS. 9A-9E and 10E-10I, a separated device is shown in partial cross-sectional views. It is however possible that a plurality of semiconductor devices are fabricated at a time and separated into individual pieces on dicing or cutting. In addition, in the steps from FIGS. 9A to 9E, semiconductor devices may be formed on both sides of the support member to improve the productivity.

A modification 1 of the exemplary embodiment 1 of the manufacturing method according to the present invention will now be explained. FIGS. 11A to 11D depict cross-sectional views showing the manufacturing method for the semiconductor device according to a modification 1 of the present exemplary embodiment 1. In each step of the manufacturing method, rinsing or heat treatment may be carried out as necessary. The present modification 1 differs from the exemplary embodiment 1 of the manufacturing method in that the insulation layer 13b is formed before removing the support member 26. In the following, the portion of the manufacturing method different from the exemplary embodiment 1 will be explained. It is understood that those portions that are not explained here are unchanged from the exemplary embodiment 1 of the manufacturing method.

Figure 11A:
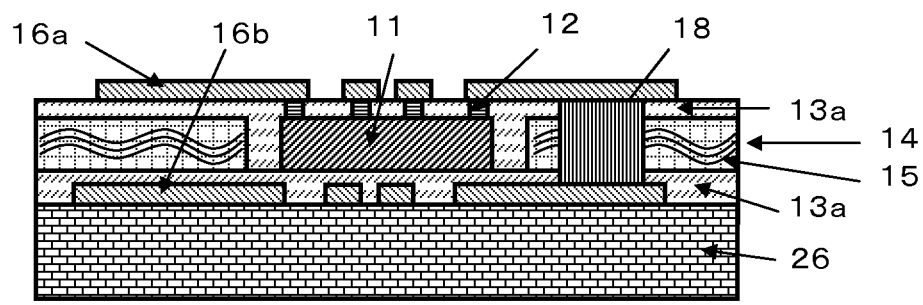
FIGS. 11A to 11D are partial cross-sectional views for illustrating a manufacturing method for the semiconductor device according to the modification 1 of the exemplary embodiment 1 of the present invention.

Note that FIG. 11A is the same as FIG. 9E, and that, up to FIG. 9E, the contents are unchanged from the corresponding portions of the exemplary embodiment 1.

Figure 11B:
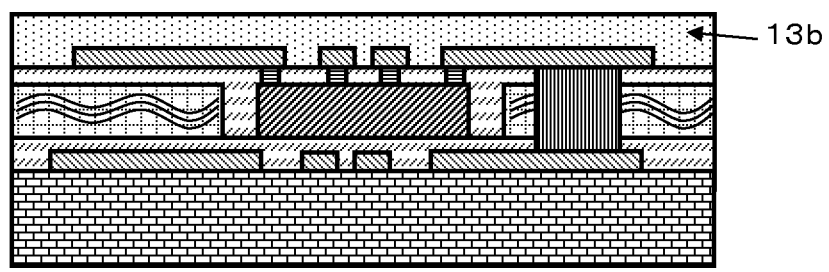

Then, as shown in FIG. 11B, the insulation layer 13b is deposited.

Figure 11C:
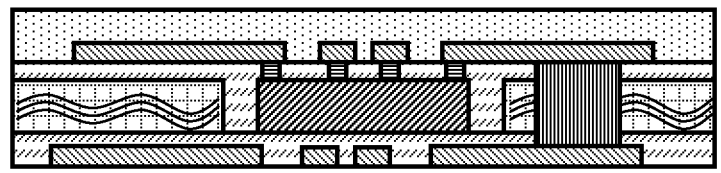

Then, as shown in FIG. 11C, the support member 26 is removed.

Figure 11D:
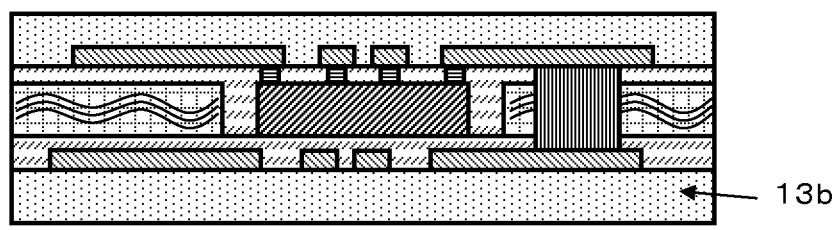

Then, as shown in FIG. 11D, the insulation layer 13b is deposited on a surface from which the insulation layer 13a is exposed. As from this time, the process steps from FIG. 10H ff. are performed.

In the modification 1 of the exemplary embodiment 1 of the manufacturing method of the semiconductor device according to the present invention, in which the insulation layer 13b is formed before removing the support member, the interconnect layer 16a is not damaged in the course of removal of the support member 26. This reduces the rate of rejects to add up to the same meritorious effect of the present modification as that of the exemplary embodiment 1 of the manufacturing method. The insulation layer 13a formed on the surface of the woven cloth containing insulation layer 14 opposite to the support member 26 is formed of the same material as the insulation material of the woven cloth containing insulation layer 14, to the exclusion of the woven cloth, or as just the woven cloth containing insulation layer 14. In this manner, the semiconductor device according to the modification of the exemplary embodiment 1 may be fabricated efficiently. By forming the insulation layer 13b from a material containing the woven cloth 22, the semiconductor device according to the exemplary embodiment 3 may be fabricated efficiently. Furthermore, by having electronic components loaded or by having a plurality of semiconductor devices laminated together, a semiconductor device according to an exemplary embodiment 4 or 5 may be fabricated efficiently. After removing the support member 26, the device being manufactured is higher in toughness than the exemplary embodiment 1 of the manufacturing method, thus assuring improved handling performance.

A modification 2 of the exemplary embodiment 1 of the manufacturing method of the present invention will now be explained. FIGS. 12A-12D depicts a partial cross-sectional view showing the manufacturing method for the semiconductor device according to the modification 2 of the exemplary embodiment 1. In each step of the manufacturing method, rinsing or heat treatment may be carried out as necessary. The present modification 2 differs from the exemplary embodiment 1 of the manufacturing method in that the insulation layer 13b is formed on the support member 26, and in that the support member 26 is removed after forming the insulation layer 13b that overlies the interconnect layer 16a. In the following, the portion of the manufacturing method different from the exemplary embodiment 1 will be explained. It is understood that those portions that are not explained here are unchanged from the corresponding portions of the exemplary embodiment 1 of the manufacturing method.

Figure 12A:
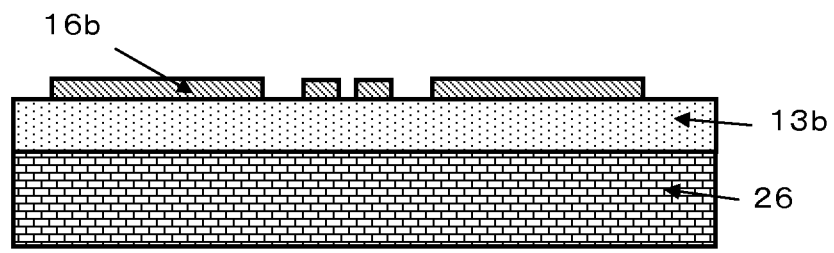
FIGS. 12A to 12D are partial cross-sectional views for illustrating a manufacturing method for the semiconductor device according to the modification 2 of the exemplary embodiment 1 of the present invention.

Initially, the insulation layer 13b is formed on the support member 26, as shown in FIG. 12A. An interconnect layer 16b is formed on the insulation layer 13b.

Figure 12B:
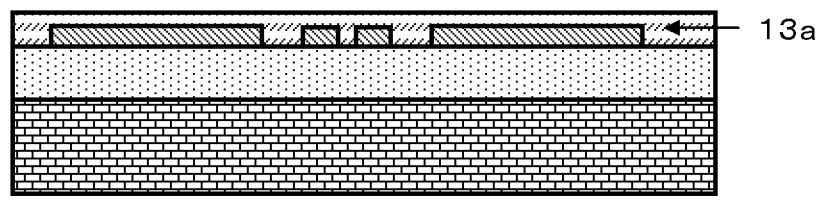

Then, as shown in FIG. 12B, the insulation layer 13a is formed for overlying the interconnect layer 16b.

Figure 12C:
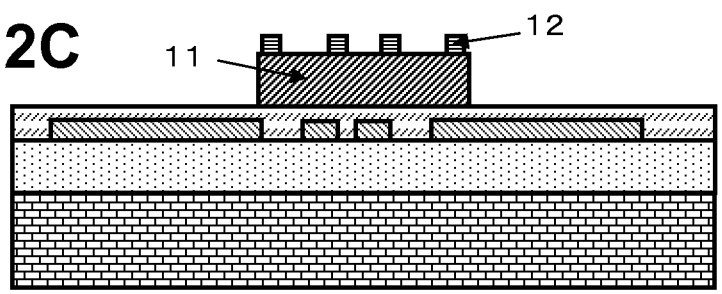

Then, as shown in FIG. 12C, a semiconductor element 11 is bonded to the insulation layer 13a. A second via 12 has been formed in the semiconductor element 11.

Figure 12D:
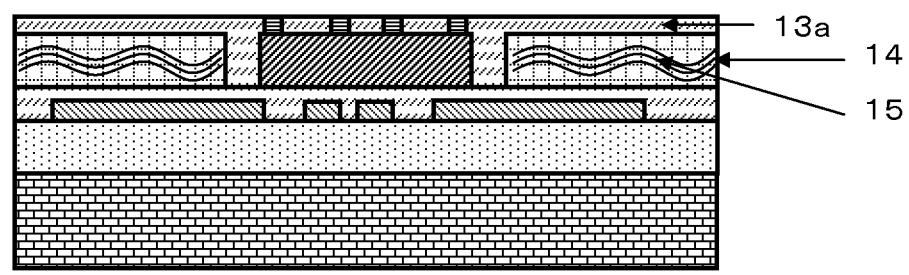

Then, as shown in FIG. 12D, a woven cloth containing insulation layer 14 is formed for further overlying the insulation layer 13a.

Figure 13E:
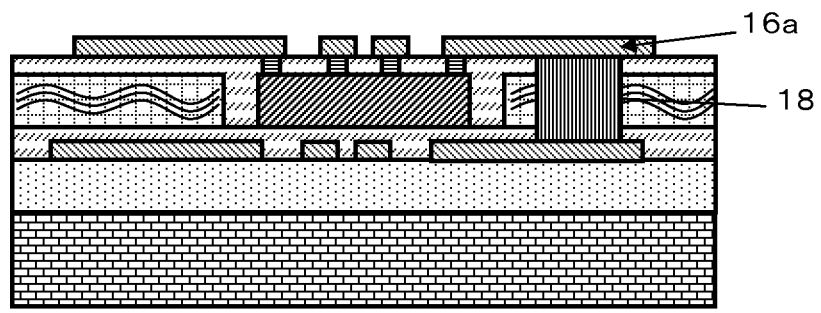
FIGS. 13E to 13G are partial cross-sectional views for illustrating a manufacturing method for the semiconductor device according to the modification 2 of the exemplary embodiment 1 of the present invention.

Then, as shown in FIG. 13E, a first via 18 and an interconnect layer 16a are formed. The interconnect layer 16a is interconnected to the second via 12.

Figure 13F:
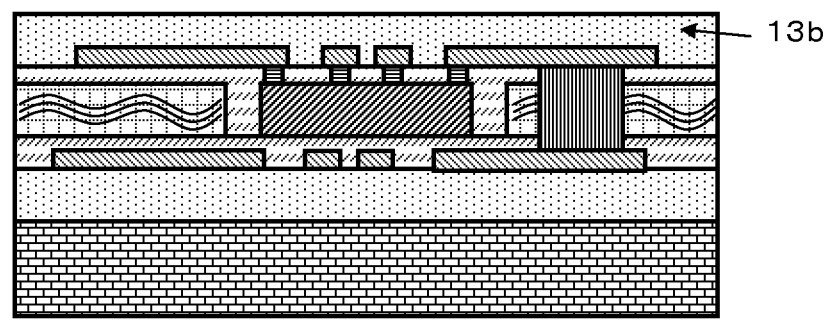

Then, as shown in FIG. 13F, the insulation layer 13b is formed for overlying the interconnect layer 16a.

Figure 13G:
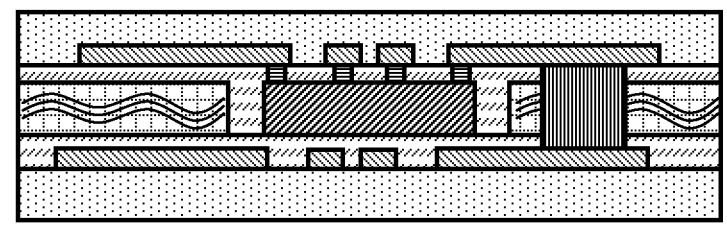

Then, as shown in FIG. 13G, the support member 26 is removed. As from this time, the process steps from the step of FIG. 10H are carried out.

In the modification 2 of the exemplary embodiment 1 of the manufacturing method of the semiconductor device, according to the present invention, both side insulation layers 13b are formed before removing the support member. Hence, there is only little risk of the insulation layers 16a, 16b being damaged by the process step of removing the support member 26. This reduces the rate of rejects as compared to the case of the modification 1 to add up to the same meritorious effect as the exemplary embodiment 1 of the manufacturing method. The insulation layer 13a formed on the surface of the woven cloth containing insulation layer 14 opposite to the support member 26 may be formed of an insulation material of the woven cloth containing insulation layer 14, to the exclusion of the woven cloth 15, or just the woven cloth containing insulation layer 14. In this manner, the semiconductor device according to the modification of the exemplary embodiment 1 may be fabricated efficiently. By using a material containing the woven cloth 22 as the insulation layer 13b, a semiconductor device according to the exemplary embodiment 3 may be fabricated efficiently. Furthermore, by having electronic components loaded or by having a plurality of semiconductor devices laminated together, a semiconductor device according to the exemplary embodiment 4 or 5 may be fabricated efficiently. After removing the support member 26, the device being manufactured is higher in toughness than the exemplary embodiment 1 of the manufacturing method or its modification 1, thus improving the handling performance.

An exemplary embodiment 2 of the manufacturing method according to the present invention will now be explained. FIGS. 14A-14D depicts a partial cross-sectional view showing a method for manufacturing a semiconductor device according to the present exemplary embodiment. Note that, in each process step, rinsing or heat treatment may be carried out as necessary.

Figure 14A:
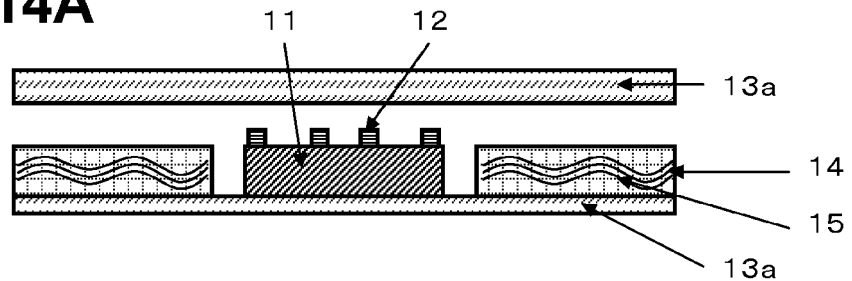
FIGS. 14A to 14D are partial cross-sectional views for illustrating a manufacturing method for the semiconductor device according to the exemplary embodiment 2 of the present invention.

Initially, as shown in FIG. 14A, the positions of an insulation layer 13a, provided on a surface of the semiconductor element 11 opposite to its surface provided with the second vias 12, a woven cloth containing insulation layer 14, a semiconductor element 11, and another insulation layer 13a, arranged overlying the surface provided with the second vias 12, are matched. In the position matching of the semiconductor element 11 and the woven cloth containing insulation layer 14, the semiconductor element 11 and/or the woven cloth containing insulation layer 14 may be bonded to the insulation layer 13a provided on the surface of the semiconductor element 11 opposite to its surface provided with the second via 12.

The insulation layer 13a may be formed of an organic material as typified by the organic materials used for the insulation layers 13a, 13b of the exemplary embodiment 1. The insulation layer 13a may be formed of a material containing reinforcement fibers. If the material of the insulation layer 13a is a liquid material, it may be deposited on a separate support material by spin coating, curtain coating, die coating, spraying or printing in the form of a film. The support material may then be separated or peeled off to obtain the film.

If the material is a film-shaped organic material, it is used on its own. The woven cloth containing insulation layer 14 is formed of, for example, an organic material, which may be an organic material as typified by the organic materials to be used for the insulation layers 13a, 13b of the exemplary embodiment 1. The woven cloth 15 is contained as the reinforcement material. The woven cloth 15 is effective not only to reduce the difference between the thermal expansion coefficient of the organic material used in the woven cloth containing insulation layer 14 and that of the semiconductor element 11, but also imparts toughness to the product despite its reduced thickness. The material for the woven cloth 15 may, for example, be glass fibers or fibers of the organic materials. As these organic materials, polyimide, polyamide, PBO (Polybenzoxazole), liquid crystal polymers and fluorine polymers, for example, are desirable from the perspective of toughness and thin thickness. Glass fibers are more desirable from the perspective of costs and the thermal expansion coefficient The woven cloth containing insulation layer 14, inclusive of the woven cloth 15, is provided with an opening in which the semiconductor element 11 is to be disposed. In forming the opening in the woven cloth containing insulation layer 14 and in the woven cloth 15, laser working, punch press working, dicing, water cutting, blasting, routing or a drill may be used. Given that a mask by a metal film or a resist material is used, the opening may be formed by dry etching. The direction of the side of the opening is set to satisfy a preset relationship with respect to the fiber direction of the woven cloth 15, as set out above.

The semiconductor element 11 is set on the insulation layer 13a. In bonding the semiconductor element 11, if the insulation layer 13a is in a pre-cure state or otherwise exhibits a desired bonding performance, the semiconductor element may be bonded on its own. If there lacks the desired bonding performance, or the bonding performance is labile, a liquid or sheet-like adhesive may be used. For example, the adhesive is formed of a resin, such as epoxy, epoxy acrylate, urethane acrylate, polyester, phenolic resin or polyimide.

The semiconductor element 11 may be provided with a plurality of second vias 12. For the second vias 12, connection is not by a solder material or a resin component, that is, by a paste material or an anisotropic electrically conductive material, and a stable tough connection portion is provided. Specifically, the connecting portion is provided by vapor deposition, sputtering, CVD (Chemical Vapor Deposition), ALD (Atomic Layer Deposition), electroless plating or electroplating. As an example manufacturing method, a current supplying layer is provided by vapor deposition, sputtering, CVD, ALD or electroless plating. Then, by electroplating or electroless plating, a desired film thickness is obtained in accordance with the semi-additive method. However, a paste material by nano-particles may also be used in case a resin component is dissipated, or in case a resin component is sublimated when temperature is applied to form a sintered body.

To reduce the thickness of the semiconductor device 10c, the semiconductor element 11 is preferably finished to a thin thickness. Specifically, the film thickness is not greater than 300 μm, preferably not greater than 150 μm and more preferably not greater than 100 μm. In the present exemplary embodiment, a semiconductor element 11, 50 μm in thickness, in which a post of copper, 20 μm in height, was formed by electroplating as second via 12, was set on an as-cured insulation layer 13a and bonded thereto using an epoxy adhesive 20 μm thickness. A pre-preg material, 50 μm in thickness, composed of a glass cloth impregnated with epoxy resin, was used as the woven cloth containing insulation layer 14. On the other hand, a sheet-shaped epoxy resin, 20 μm in thickness, was used as the insulation layer 13a disposed on the woven cloth containing insulation layer 14.

Figure 14B:
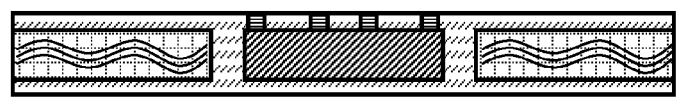

A layer in which the semiconductor element 11 is embedded was formed, as shown in FIG. 14B, as an embedding layer. This embedding layer was formed by a manufacturing method as typified by a lamination method or a press-working method each added by a vacuum state. To prevent contact with another layered object at the time of lamination and to provide for ease in handling, protective materials, capable of separation or removal, may be used for lamination.

During this process, the semiconductor element 11 may be covered up as the material used for the insulation layers 13a formed on both sides of the woven cloth containing insulation layer 14 is identified with the insulation material composing the woven cloth containing insulation layer 14 to the exclusion of the woven cloth 15. The semiconductor element 11 may also be covered up as the insulation layer 13a bonded to the semiconductor element 11 is identified with the insulating material of the woven cloth containing insulation layer 14 to the exclusion of the woven cloth 15 and as the fluidity of the material comprised of the insulation material used as the woven cloth containing insulation layer 14 to the exclusion of the woven cloth 15 is utilized.

In the present exemplary embodiment, lamination was carried out simultaneously using a vacuum laminator, and the woven cloth containing insulation layer 14 and the insulation layer 13a were heat-treated together by way of curing.

Figure 14C:
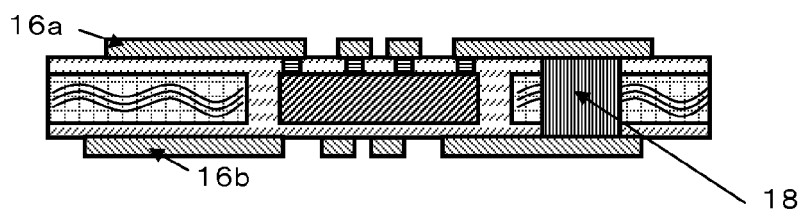

Then, as shown in FIG. 14C, the first via 18 and the interconnect layers 16a, 16b are formed. The hole part of the first via 18 may be formed by a laser, dry etching or blasting, and the via part may be formed in the course of forming the interconnect layers 16a, 16b. Or, the hole part of the via may be charged with the electrically conductive material by electroplating, electroless plating or printing, after which the interconnect layers 16a, 16b may be formed. Alternatively, electrically conductive materials, such as metal, may be buried at the outset in a portion which is to become the first via 18. The insulation layer 13a and the woven cloth containing insulation layer 14 are then formed. The portion of these layers on top of the via is then removed by buffing, dry etching, CMP, polishing or lapping to expose the electrically conductive material to form the first via 18.

Although FIGS. 14A-14D show the hole of the first via 18 as a vertically extending wall section, the hole wall may also be tapered. The interconnect layer 16a is formed so as to be connected to the second via 12. The second via 12 has its connection portion formed as indicated in FIG. 9C. In case the second via 12 is thicker in thickness than the finishing film thickness of the insulation layer 13a, the second via 12 is exposed, before forming the interconnect layer 16a, by buffing, dry etching, CMP, polishing or lapping. In case the second via 12 is thinner in thickness than the insulation layer 13a, the hole part is formed by a laser, dry etching or blasting, and connection is established in the process of forming the interconnect layer 16a. The interconnect layer 16a may be formed by an interconnection technique as set out above with reference to FIG. 9A. The interconnect layers 16a, 16b may be formed simultaneously or separately.

In the present exemplary embodiment, the hole part of the first via 18 is formed by a laser, and the inside of the hole part is charged with copper plating at the same time as the interconnect layers 16a, 16b on either sides are formed. As for the second via 12, the copper post 30 μm in height was formed, as set out previously. The surface of the insulation layer 13a, overlying the second via 12, is polished by buffing to expose the connection point. The interconnect layers 16a, 16b were formed to a film thickness of 10 μm, using the semi-additive method, in which the film formed on sputtering was used as a current supplying layer.

Figure 14D:
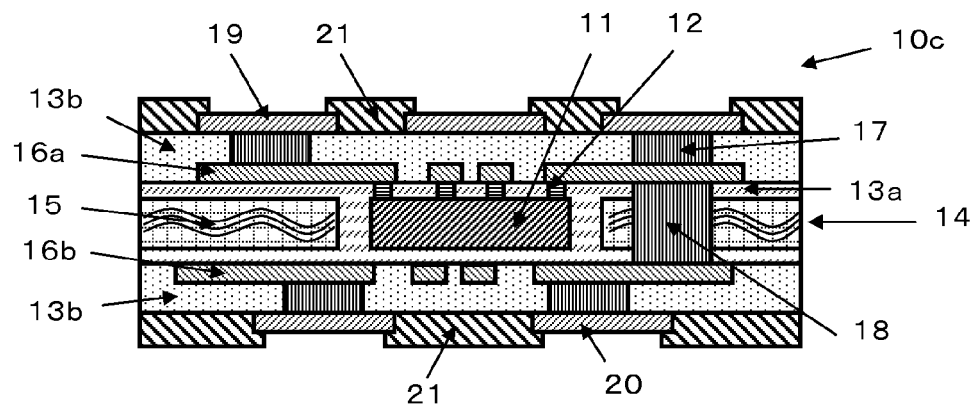

Then, as shown in FIG. 14D, a solder resist 21 is formed on each of the upper and lower surfaces. The solder resist 21 is formed so as to leave the portions which later become the first electrode 19 and the second electrode 20 open. In case the opening left open by the solder resist is larger than the first electrode 19 or the second electrode 20, the solder material may form the connection surface on the sidewall section of the first electrode 19 or the second electrode 20, thus assuring improved connection reliability. If an electrode is further provided, the solder resist 21 may also be used for relaxing the stress, thus further improving the reliability.

The first electrode 19 and the second electrode 20 are made up of a plurality of layers laminated together. The surfaces of the first electrode 19 and the second electrode 20 are provided with at least one metal or alloy selected from the group consisting of copper, aluminum, gold, silver and a solder material, in consideration of wettability of the solder balls or connectivity to a bonding wire. The solder balls are provided on the surfaces of the first electrode 19 and the second electrode 20. It is sufficient to select structures of the first and second electrodes 19, 20 so that the structures selected will be effective for connection. Hence, the first and second electrodes do not have to be of the same structure. The solder resist 21 is formed of, for example, an organic material, and may be formed of an organic material used for e.g., the insulation layers 13a, 13b of the exemplary embodiment 1.

The organic material used may be photosensitive or non-photosensitive. In case of using the photosensitive organic material, a hole is bored by e.g., photolithography. In case of using the non-photosensitive organic material or a material which is photosensitive and low in pattern resolution, a hole is bored using a laser, dry etching or blasting.

In the present exemplary embodiment 2, an opening is formed using the photosensitive solder resist 21. A Ni layer and a gold layer were deposited on a Cu layer, by electroless plating, as the first electrode 19 or the second electrode 20, so that the Au layer will form a top layer. The Ni layer was 3 μm in thickness, whilst the Au layer was 1 μm in thickness.

In the exemplary embodiment 2 of the manufacturing method for the semiconductor device according to the present invention, the semiconductor device of the exemplary embodiment 2 may be manufactured efficiently. By using the insulation material, which is the woven cloth containing insulation layer 14 to the exclusion of the woven cloth 15, or by using the insulation material, which is formed just by woven cloth containing insulation layer 14, as the material for the woven cloth containing insulation layer 14 and for the insulation layers 13a, the semiconductor device of the modification of the exemplary embodiment 2 may be manufactured efficiently. By using a material containing the woven cloth 22 as the insulation layers 13b, the semiconductor device of the exemplary embodiment 3 may be manufactured efficiently. Moreover, by having an electronic component loaded or by having a plurality of semiconductor devices laminated together, the semiconductor device of the exemplary embodiment 4 or 5 may be manufactured efficiently. Although FIGS. 14A-14D show a separated semiconductor device by a partial cross-sectional view, it is also possible to fabricate at a time a plurality of semiconductor devices which may then be separated into individual pieces of semiconductor devices by dicing or severing.

Although the present invention has so far been described with reference to several exemplary embodiments, the present invention is not to be limited to the configuration of the above described exemplary embodiments. It is to be noted that the present invention comprises various modifications and corrections that may be arrived at by those skilled in the art within the scope of the invention.

The disclosure of the aforementioned Patent Documents is incorporated by reference herein. The particular exemplary embodiments or examples may be modified or adjusted within the scope of the entire disclosure of the present invention, inclusive of claims, based on the fundamental technical concept of the invention. Further, a variety of combinations or selection of elements in claims, examples and figures disclosed herein may be made within the framework of the claims. That is, the present invention may cover a wide variety of modifications or corrections that may occur to those skilled in the art in accordance with the entire disclosure of the present invention, inclusive of claim and the technical concept of the present invention.

In the present disclosure the following modes are possible.
(Mode 1) In the method for manufacturing a semiconductor device, in the forming at least one interconnect layer and at least one insulation layer for overlying said semiconductor element and said embedding layer, the first via may be formed to traverse said embedding layer.
(Mode 2) In the forming at least one interconnect layer and at least one insulation layer for overlying said semiconductor element and said embedding layer, a second via may be formed for interconnecting said interconnect layer and said semiconductor element.

(Mode 3) The method may further comprise: having another electronic component loaded thereon.

(Mode 4) A method for manufacturing a semiconductor device may be comprise: stacking a plurality of the semiconductor devices disclosed herein.

EXPLANATIONS OF SYMBOLS 10a to 10g: semiconductor devices
11: semiconductor element
12: second via
13a, 13b: insulation layers
14: woven cloth containing insulation layer
15, 22: woven cloths
16a, 16b: interconnect layers
17: via
18: first via
19: first electrode
20: second electrode
21: solder resist
23: electronic component
24, 25: connection portions
26: support member
27: reinforcement fibers
27a, 27b: fibers
28: opening

The invention claimed is:

1. A semiconductor device, comprising an embedding layer having one or a plurality of semiconductor elements embedded therein; said semiconductor device also comprising one or a plurality of interconnect layers and one or a plurality of insulation layers on one or both sides of said embedding layer; wherein
    said embedding layer includes a woven cloth formed by reinforcement fibers;
    said woven cloth including an opening on a site of embedding said semiconductor element;
    said opening being arranged so that a direction of said reinforcement fibers will have a preset angle with respect to a direction of a side of or a tangent to at least a portion of said opening; said preset angle being other than a square angle or a zero angle (parallelism).

2. The semiconductor device according to claim 1, wherein,
    for an interval of two neighboring exposed bundles of said fibers, extending in one direction, on at least one side of said opening, there are not larger than five exposed bundles of another fibers, extending in another direction substantially at right angles to said one direction.

3. The semiconductor device according to claim 1, wherein,
    on at least one side of said opening, an angle a side wall of said opening makes with said reinforcement fibers is 18° to 72°.

4. The semiconductor device according to claim 1, wherein,
    said opening is rectangular in shape.

5. The semiconductor device according to claim 1, wherein,
    said opening is of a shape corresponding to combination of a plurality of rectangles, each side of which has a same direction, or of a shape of a polygon.

6. The semiconductor device according to claim 1, wherein,
    said opening is circular or elliptical in shape.

7. The semiconductor device according to claim 1, wherein,
    said reinforcement fibers are a glass cloth.

8. The semiconductor device according to claim 1, wherein,
    a first via interconnecting said interconnect layers formed on both sides of said embedding layer penetrates said embedding layer.

9. The semiconductor device according to claim 1, wherein,
    one of said interconnect layers formed on both sides of said embedding layer is electrically connected to said semiconductor element via a second via bored on a surface of and down to said semiconductor element.

10. The semiconductor device according to claim 1, wherein,
    at least one of said insulation layers provided on both sides of said embedding layer includes said reinforcement fibers.

11. The semiconductor device according to claim 10, wherein,
    said reinforcement fibers of said insulation layer(s) are in the form of a woven cloth.

12. The semiconductor device according to claim 10, wherein,
    said reinforcement fibers of said insulation layer(s) are in the form of a glass cloth.

13. The semiconductor device according to claim 10, wherein,
    the direction of said reinforcement fibers of said insulation layers and that of said reinforcement fibers of said embedding layers differ from each other.

14. The semiconductor device according to claim 9, wherein,
    a diameter of said first via is larger than that of said second via.

15. The semiconductor device according to claim 1, wherein,
    an electronic component is additionally mounted on a surface thereof.

16. A semiconductor device, comprising a plurality of said semiconductor devices according to claim 1 are disposed in a laminated or stacked fashion.

17. A method for manufacturing a semiconductor device having one or a plurality of semiconductor element(s) embedded therein; said method comprising:
    forming an embedding layer containing a woven cloth for reinforcement having an opening in an area around said semiconductor element; said woven cloth for reinforcement being arranged so that a direction of said reinforcement fibers will have a preset angle with respect to a direction of a side of or a tangent to at least a portion of said opening; said preset angle being other than a square angle or a zero angle (parallelism); and
    forming at least one interconnect layer and at least one insulation layer on both sides of the semiconductor device for overlying said semiconductor element and said embedding layer.

18. A method for manufacturing a semiconductor device having one or a plurality of semiconductor element(s) embedded therein; said method comprising:
    forming at least one interconnect layer and at least one insulation layer on a support member;
    setting a semiconductor element on said insulation layer;

forming, in an area around said semiconductor element, an embedding layer containing a woven cloth for reinforcement having an opening in an area around said semiconductor element; said woven cloth for reinforcement being arranged so that the direction of said reinforcement fibers will have a preset angle with respect to a direction of a side of or a tangent to at least a portion of said opening; said preset angle being other than a square angle or a zero angle (parallelism);

forming at least one interconnect layer and at least one insulation layer for overlying said semiconductor element and said embedding layer; and removing said support member.

19. The method for manufacturing a semiconductor device according to claim 18, further comprising:

forming at least one interconnect layer and at least one insulation layer next to said support member removing step.

20. The method for manufacturing a semiconductor device according to claim 17, wherein, in said forming the embedding layer containing the woven cloth for reinforcement in an area around said semiconductor element, a first via is formed in said embedding layer.

* * * * *

UNITED STATES PATENT AND TRADEMARK OFFICE
CERTIFICATE OF CORRECTION

| | |
|---|---|
| PATENT NO. | : 8,692,364 B2 |
| APPLICATION NO. | : 13/389234 |
| DATED | : April 8, 2014 |
| INVENTOR(S) | : Katsumi Kikuchi et al. |

It is certified that error appears in the above-identified patent and that said Letters Patent is hereby corrected as shown below:

IN THE SPECIFICATION:

Column 7, Line 36: Before "supply" delete "425".

Signed and Sealed this
Sixteenth Day of December, 2014

Michelle K. Lee
*Deputy Director of the United States Patent and Trademark Office*